US012707972B2

(12) United States Patent
Oruganti et al.

(10) Patent No.: US 12,707,972 B2
(45) Date of Patent: Aug. 11, 2026

(54) HETEROGENEOUSLY INTEGRATED LIQUID ELECTROLYTE POWERED PROCESSOR

(71) Applicant: Microsoft Technology Licensing, LLC, Redmond, WA (US)

(72) Inventors: Vaidehi Oruganti, Kirkland, WA (US); Bharath Ramakrishnan, Bellevue, WA (US); Husam Atallah Alissa, Redmond, WA (US); Christian L. Belady, Mercer Island, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 600 days.

(21) Appl. No.: 18/133,443

(22) Filed: Apr. 11, 2023

(65) Prior Publication Data

US 2024/0347421 A1 Oct. 17, 2024

(51) Int. Cl.
*H10W 40/47* (2026.01)
*H10W 20/42* (2026.01)

(52) U.S. Cl.
CPC ........... *H10W 40/47* (2026.01); *H10W 20/42* (2026.01)

(58) Field of Classification Search
CPC .................................................... H01L 23/473
USPC ......................................................... 257/714
See application file for complete search history.

(56) References Cited

U.S. PATENT DOCUMENTS 9,285,324 B2 3/2016 Leuenberger Jockel
9,679,827 B2 6/2017 Vishkin
10,558,249 B2 * 2/2020 Bose ......................... G06F 1/20
10,852,268 B2 12/2020 Hahn et al.
11,482,472 B2 * 10/2022 Eid ..................... H01L 25/0655
11,909,449 B1 2/2024 Oruganti
2004/0258970 A1 12/2004 Mclean
2021/0166991 A1 6/2021 Liu
2024/0405879 A1 12/2024 Oruganti

FOREIGN PATENT DOCUMENTS

CN 114446907 A 5/2022
CN 115881667 A 3/2023
WO 2012038843 A1 3/2012

OTHER PUBLICATIONS

Brunschwiler, et al., “Towards Cube-Sized Compute Nodes: Advanced Packaging Concepts Enabling Extreme 3D Integration”, 2017 IEEE International Electron Devices Meeting (IEDM), IEEE, Dec. 2, 2017, 4 pages.

(Continued)

*Primary Examiner* — Ajay Arora

(74) *Attorney, Agent, or Firm* — Ray Quinney & Nebeker P.C.; John O. Carpenter

(57) ABSTRACT

A processing unit includes a substrate, an electrical load, and a microfluidic volume. The electrical load is supported by the first surface of the substrate, and the microfluidic volume is positioned in the second surface of the substrate. The processing unit includes a first electrode positioned in the microfluidic volume and a second electrode positioned in the microfluidic volume. A first TSV connects the first electrode to the electrical load, and a second TSV connects the second electrode to the electrical load. An electrochemical fluid is positioned in the microfluidic volume to provide electrical power to the electrical load and receive heat from the electrical load.

20 Claims, 7 Drawing Sheets

(56) References Cited

OTHER PUBLICATIONS

International Search Report and Written Opinion received for PCT Application No. PCT/US2024/030149, Sep. 18, 2024, 12 pages.
Invitation to Pay Additional Fees received for PCT Application No. PCT/US2024/022698, Oct. 1, 2024, 17 pages.
Non-Final Office Action mailed on Jul. 31, 2024, in U.S. Appl. No. 18/412,283, 6 pages.
Ruch, et al., "Toward Five-Dimensional scaling: How Density Improves Efficiency in Future Computers", IBM Journal of Research and Development, vol. 55, No. 5, Jan. 1, 2011, pp. 1-13.
Rajan, et al., "Integrated Silicon Microfluidic Cooling of a High-Power Overclocked CPU for Efficient Thermal Management", In Journal of IEEE Access, vol. 10, May 30, 2022, pp. 59259-59269.
"International Search Report and Written Opinion issued in PCT Application No. PCT/US2024/022698", Mailed Date Nov. 26, 2024, 19 Pages.
Notice of Allowance mailed on Jan. 17, 2025, in U.S. Appl. No. 18/412,283, 09 Pages.
"Notice of Allowance Issued in U.S. Appl. No. 18/204,052", Mailed Date: Oct. 13, 2023, 10 Pages.
U.S. Appl. No. 18/204,052, filed May 31, 2023.
International Preliminary Report on Patentability (Chapter I) received for PCT Application No. PCT/US2024/022698, mailed on Oct. 23, 2025, 12 pages.
International Preliminary Report on Patentability (Chapter I) received for PCT Application No. PCT/US2024/030149, mailed on Dec. 11, 2025, 09 pages.

* cited by examiner

HETEROGENEOUSLY INTEGRATED LIQUID ELECTROLYTE POWERED PROCESSOR

BACKGROUND

Background and Relevant Art

Conventional processing units are powered and cooled by discrete power supplies and cooling systems. As the density of compute resources, such as in server configurations and/or in datacenters, increases, the available space for power delivery and heat removal decreases.

BRIEF SUMMARY

In some embodiments, a processing unit includes a substrate, an electrical load, and a microfluidic volume. The electrical load is supported by the first surface of the substrate, and the microfluidic volume is positioned in the second surface of the substrate. The processing unit includes a first electrode positioned in the microfluidic volume and a second electrode positioned in the microfluidic volume. A first TSV connects the first electrode to the electrical load, and a second TSV connects the second electrode to the electrical load. An electrochemical fluid is positioned in the microfluidic volume to provide electrical power to the electrical load and receive heat from the electrical load.

[B1] In some embodiments, a processing unit includes a substrate, an electrical load, and an electrochemical chamber. The electrical load is supported by the first surface of the substrate, and the electrochemical chamber is positioned in the substrate. The electrochemical chamber includes an ion-transfer membrane dividing the electrochemical chamber into a first portion and a second portion. The electrochemical chamber includes a first electrode positioned in the first portion and a second electrode positioned in the second portion. A pin fin is positioned in the electrochemical chamber and configured to support the ion-transfer membrane relative to the substrate. A TSV in the pin fin connects one of the first electrode and the second electrode to the electrical load. A first electrochemical fluid is positioned in the first volume and a second electrochemical fluid is positioned in the second volume to provide electrical power to the electrical load and receive heat from the electrical load.

In some embodiments, a system for electrochemical generation includes a processing unit, a first electrochemical storage tank, a second electrochemical storage tank, and a heat exchanger. The processing unit includes a substrate, an electrical load, and an electrochemical chamber. The electrical load is supported by the first surface of the substrate, and the electrochemical chamber is positioned in the second surface of the substrate. The electrochemical chamber includes an ion-transfer membrane dividing the electrochemical chamber into a first portion and a second portion. The electrochemical chamber includes a first electrode positioned in the first portion and a second electrode positioned in the second portion. A first TSV connects the first electrode to the electrical load, and a second TSV connects the second electrode to the electrical load. A first electrochemical fluid is positioned in the first volume and a second electrochemical fluid is positioned in the second volume to provide electrical power to the electrical load and receive heat from the electrical load. The first electrochemical storage tank is in fluid communication with the first portion, and the second electrochemical fluid storage tank is in fluid communication with the second portion. The heat exchanger is in fluid communication with at least one of the first electrochemical fluid and second electrochemical fluid and configured to exhaust heat from the at least one of the first electrochemical fluid and second electrochemical fluid.

This Summary is provided to introduce a selection of concepts in a simplified form that are further described below in the Detailed Description. This Summary is not intended to identify key features or essential features of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 1-2 is a diagram of the electrochemical system of FIG. 1-1 with a charging device, according to at least some embodiments of the present disclosure;

FIG. 2 is a perspective cross-sectional view of a processing unit with electrochemical generation, according to at least some embodiments of the present disclosure;

DETAILED DESCRIPTION

Figure 1:
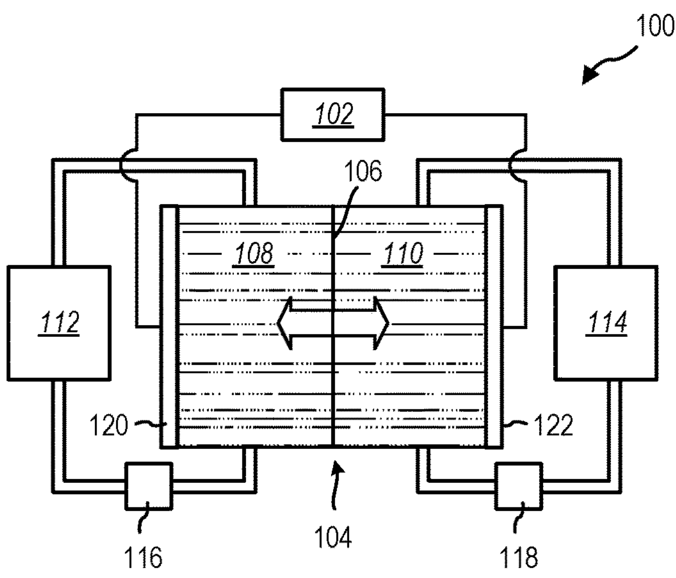
FIG. 1-1 is a diagram of an electrochemical system, according to at least some embodiments of the present disclosure.

The present disclosure generally relates to systems and methods for providing electrical power and thermal management to a processor. More particularly, the present disclosure relates to power generation using an electrochemical fluid in a microfluidic volume of a processor or other heat-generating electronic component with heat exhausted from the microfluidic volume by the electrochemical fluid. In some embodiments, at least a portion of an electrochemical flow battery and/or generator is located in the microfluidic volume of an inactive silicon or other substrate wafer of the processor or other heat-generating electronic component. For example, an electrochemical fluid, such as an anolyte or catholyte, flows into the microfluidic volume such that an electrical voltage and current is produced in the microfluidic volume from the electrochemical fluid to power the processor. The electrical power is provided to the processor by electrical communication from the microfluidic volume by through silicon vias (TSVs) positioned in the wafer. The electrochemical fluid receives heat from the processor or other heat-generating electronic component, and the electrochemical fluid flows out of the microfluidic volume to exhaust heat from the processor or other heat-generating electronic component.

In some embodiments, a heat-generating component according to the present disclosure includes a processor or processing device. In some embodiments, the heat-generating component is a generalized processing device, such as a central processing unit (CPU) or graphical processing unit (GPU); a specialized device application-specific integrating circuit (ASIC); a memory module (such as cache memory, volatile memory, or non-volatile memory); or other electronic or processing components. The heat-generating component generates heat during use.

In a conventional processor, a die is connected to a printed circuit board (PCB), which delivers electrical power to the die via one or more wire traces. The delivery of electrical power through the wire traces can be inefficient from an electrical standpoint and/or a design space standpoint. Further, conventionally, heat generated by the processor is transmitted by a thermal interface material (TIM) to a heat spreader that is in contact with a heat sink or other interface to exhaust the heat to a liquid coolant or to the ambient atmosphere. In some instances, the thermal management components and interfaces can limit the amount of heat exhausted. In the case of multi-die processors, conventional thermal management may be incapable of cooling all dies in the processor.

In some embodiments, an electrochemical fluid (such as a Vanadium salt) positioned in the microfluidic volume allows a processor or other heat-generating component to receive power from the electrochemical fluid, directly. The local power generation of the electrochemical fluid may limit and/or eliminate the need for electrical power delivery by wire traces from a power supply unit. Further, direct power delivery and/or thermal management of the electrochemical fluid may allow for more efficient power delivery and/or thermal management. For example, the electrochemical fluid may produce an electrical voltage on the order of that used by the processor or other heat-generating component without need for transforming electrical power (e.g., 120-Volt power) obtained from a grid or an on-site powerplant.

In some embodiments, the electrochemical fluid is urged through the first microfluidic volume and through the second microfluidic volume at the same flow rate. For example, a manifold forming at least a portion of the side wall of the microfluidic volumes may be connected to an inlet conduit may provide equal flow rate and/or equal fluid pressure to both the first microfluidic volume and the second microfluidic volume. In some embodiments, the flow rate is different, such as when different thermal management or power delivery is required by different portions of the processor or other heat-generating component. For example, a first inlet conduit may provide a first flow rate and/or fluid pressure to the first microfluidic volume and a second inlet conduit may provide a second flow rate and/or fluid pressure to the second microfluidic volume.

In some embodiments, a first electrochemical fluid (such as an anolyte) and a second electrochemical fluid (such as a catholyte) are flowed into a shared microfluidic volume with an inlet and an outlet. The first electrochemical fluid and second electrochemical fluid flow in parallel through the shared microfluidic volume with limited or no mixing. The boundary between the first electrochemical fluid and the second electrochemical fluid is substantially maintained by laminar flow of the first electrochemical fluid and second electrochemical fluid through the microfluidic volume with limited turbulence.

In some embodiments, combined electrical power delivery and thermal management by electrochemical fluids in a microfluidic volume according to the present disclosure allows for an increased density of processors in computing device, a server blade, a server rack, or a datacenter. For example, local power delivery and cooling may allow for a dense stack of wafers and/or stacked-die processors that are not possible with conventional PCB power delivery and separate thermal management.

FIG. 1-1 is a schematic view of an electrochemical generation system 100 to provide electrical power to an electrical load 102 (e.g., a processor) or from an electrical source. In some embodiments, an electrochemical generation system 100 includes an electrochemical chamber 104 with an ion-transfer membrane 106 dividing the electrochemical chamber 104. The electrochemical chamber 104 includes a first electrochemical fluid 108 and a second electrochemical fluid 110 separated by the ion-transfer membrane 106. In some embodiments, ion-transfer across the ion-transfer membrane 106 between the first electrochemical fluid 108 and the second electrochemical fluid 110 produces an electric voltage and current to the processor or other electrical load 102 and discharges the first electrochemical fluid 108. In some embodiments, an applied voltage from an electrical source (in place of the electrical load) results in a reverse transfer of ions across the ion-transfer membrane 106 which charges the first electrochemical fluid 108.

In some embodiments, the electrochemical chamber 104 is in fluid communication with a first storage tank 112 and a second storage tank 114. For example, the first electrochemical fluid 108 is stored in the first storage tank 112 and can flow into the electrochemical chamber 104, and the second electrochemical fluid 110 is stored in the second storage tank 114 and can flow into the electrochemical chamber 104. A first pump 116 and second pump 118 may control the flow of the first electrochemical fluid 108 and the flow of the second electrochemical fluid 110, respectively to the electrochemical chamber 104. In some embodiments, the rate of ion-transfer across the ion-transfer membrane 106 is at least partially related to a flow rate of the first electrochemical fluid 108 and the second electrochemical fluid 110 into the electrochemical chamber 104 (and in contact with the ion-transfer membrane 106).

The electrical charge produced by the ion transfer across the ion-transfer membrane 106 may be collected at a first electrode 120 and a second electrode 122 positioned in or on the electrochemical chamber 104 on opposite sides of the ion-transfer membrane 106. For example, a first electrode 120 is in contact with the first electrochemical fluid 108 and a second electrode 122 is in contact with the second electrochemical fluid 110. The electrodes 120, 122 collect charge from the first electrochemical fluid 108 and the second electrochemical fluid 110. In some embodiments, the first electrochemical fluid 108 in an anolyte fluid, and the second electrochemical fluid 110 is a catholyte fluid. In some embodiments, the anolyte fluid and the catholyte fluid is the same fluid or compound in different states of charge. In at least one embodiment, the anolyte fluid and the catholyte fluid are or include a Vanadium salt.

Figures 1, 2:
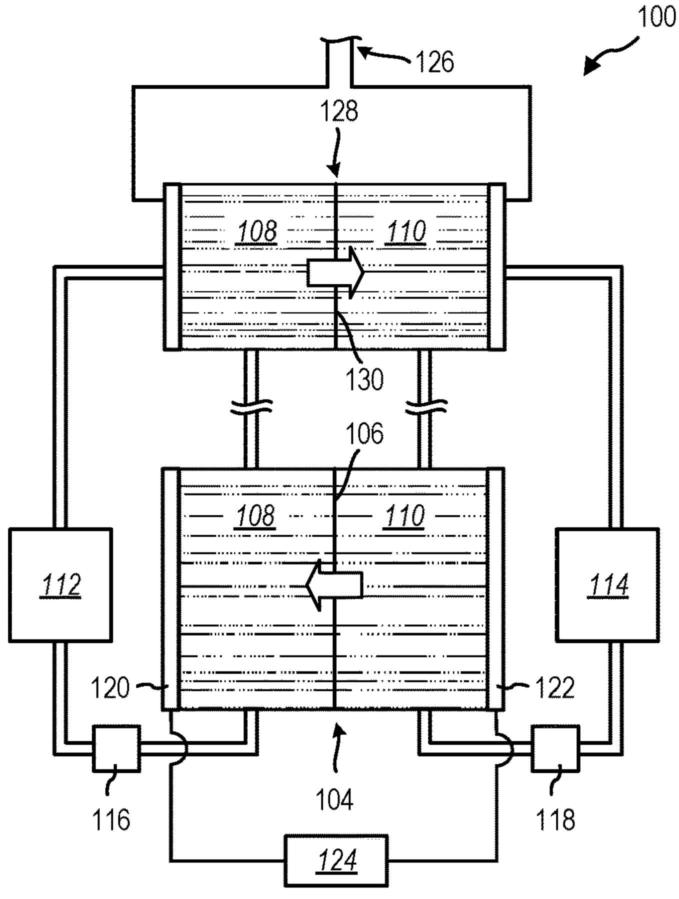
Figure 2:
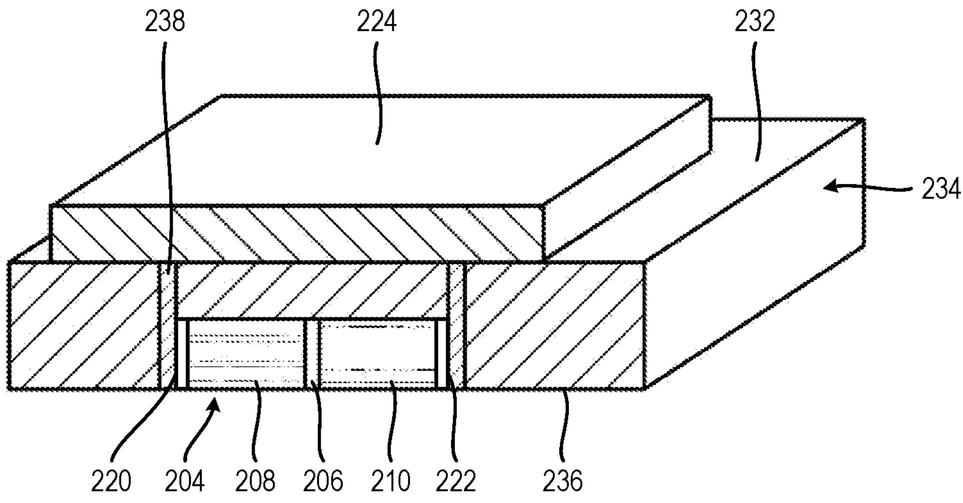

FIG. 1-2 is a schematic illustration of the electrochemical generator system 100 of FIG. 1-1 with a processor 124 as the electrical load and a separate electrical source 126 connected to a second electrochemical chamber 128. In some embodiments, an electrochemical generator system 100 includes a first electrochemical chamber 104 configured to discharge an electrochemical fluid and provide an electrical power to an electrical load (e.g., the processor 124), and the electrochemical generator system 100 includes a second electrochemical chamber 128 configured to receive electrical power from an electrical source 126 (e.g., a power grid or other power source) to recharge the electrochemical fluid 108, 110.

In some embodiments, the electrochemical fluid 108, 110 circulates through the electrochemical generator system 100, receiving electrical power from the electrical source 126 and delivering the electrical power to the electrical load, substantially continuously. In some embodiments, the electrochemical fluid 108, 110 is stored in a storage tank 112, 114 until the electrical power is needed similarly to a battery, when pumps 116, 118 flow the electrochemical fluid 108, 110. As described in relation to FIG. 1-1, a first electrochemical fluid 108 and a second electrochemical fluid 110 exchange ions across a first ion-transfer membrane 106 in the first electrochemical chamber 104 to discharge the first electrochemical fluid 108 and produce electrical power. The first electrochemical fluid 108 and a second electrochemical fluid 110 exchange ions across a second ion-transfer membrane 130 in the second electrochemical chamber 128 to charge the first electrochemical fluid 108 and store electrical power.

In some embodiments, at least a part of the electrochemical chamber configured to provide power is located in a microfluidic volume of a silicon substrate or other inactive portion of a computational package. For example, a first electrochemical fluid may be positioned in the microfluidic volume. In another example, a second electrochemical fluid may be positioned in the microfluidic volume. In yet another example, both the first electrochemical fluid and the second electrochemical fluid may be positioned in the microfluidic volume.

FIG. 2 is a cross-sectional perspective view of a processing unit with a processor 224 positioned on a first surface 232 of a silicon substrate 234 or other wafer. In some embodiments, the silicon substrate 234 has an electrochemical chamber 204 located on a second surface 236 of the silicon substrate 234 opposite the processor 224. While a heat-generating component is described in relation to a processor 224 positioned on a silicon substrate 234, it should be understood that at least some of the structures, features, and elements described herein relate to any heat-generating component with active silicon or circuitry affixed to a silicon substrate 234 or other wafer.

In some embodiments, the electrochemical chamber 204 includes an ion-transfer membrane 206 dividing the electrochemical chamber 204. The electrochemical chamber 204 includes a first electrochemical fluid 208 and a second electrochemical fluid 210 separated by the ion-transfer membrane 206. In some embodiments, ion-transfer across the ion-transfer membrane 206 between the first electrochemical fluid 208 and the second electrochemical fluid 210 produces an electric voltage and current to the processor 224 or other electrical load and discharges the first electrochemical fluid 208.

The electrical voltage and current is, in some embodiments, provided to the processor 224, active silicon, or other electrical load on the first surface 232 of the substrate 234 by TSVs 238. The TSVs 238 provide electrical communication from electrodes 220, 222 positioned in or adjacent to the electrochemical chamber 204. For example, the first electrode 220 is positioned in or adjacent to the electrochemical chamber 204 and configured to physically contact a first electrochemical fluid 208, and the second electrode 222 is positioned in or adjacent to the electrochemical chamber 204 and configured to physically contact a second electrochemical fluid 210.

In some embodiments, the electrochemical chamber 204 is configured as an elongated channel in the second surface 236 of the substrate 234. In such embodiments, the first electrochemical fluid 208 and second electrochemical fluid 210 flow through the electrochemical chamber 204 to transfer ions therebetween and provide electrical power via the electrodes 220, 222 and to absorb heat from the processor 224, active silicon, or other heat-generating component on the first surface 232 through the substrate 234.

In the illustrated embodiment of FIG. 2, the electrochemical chamber 204 is substantially rectangular in cross-section. The electrochemical chamber 204 may have a uniform transverse cross-sectional along at least a portion of a longitudinal length of the electrochemical chamber 204, as will be described in more detail herein. In some embodiments, the electrochemical chamber 204 has a non-uniform transverse cross-section that changes in at least one dimension along at least a portion of the longitudinal length of the electrochemical chamber 204. In some embodiments, at least a portion of the electrochemical chamber 204 has a transverse cross-section that is or is a portion of a rectangle, square, triangle, hexagon, other regular polygonal shape, irregular polygon shape, circle, oval, ellipse, other regular curved shape, irregular curved shape, or combinations thereof.

In the above-described example, an electrochemical chamber 204 provides both power and cooling locally to a processor 224. In some embodiments, local power production includes any production of electrical voltage or current proximate to or in the processor 224, active silicon, other electrical load, or a substrate by which the processor, active silicon, or other electrical load is supported. For example, a power supply unit (PSU) that is electrically connected to a processor through one or more wires or cables does not produce the electrical power locally to the processor, while an electrochemical chamber located in a substrate with ion transfer to create an electrical current is local to any processor, active silicon, or other electrical load located on the substrate.

Figure 3:
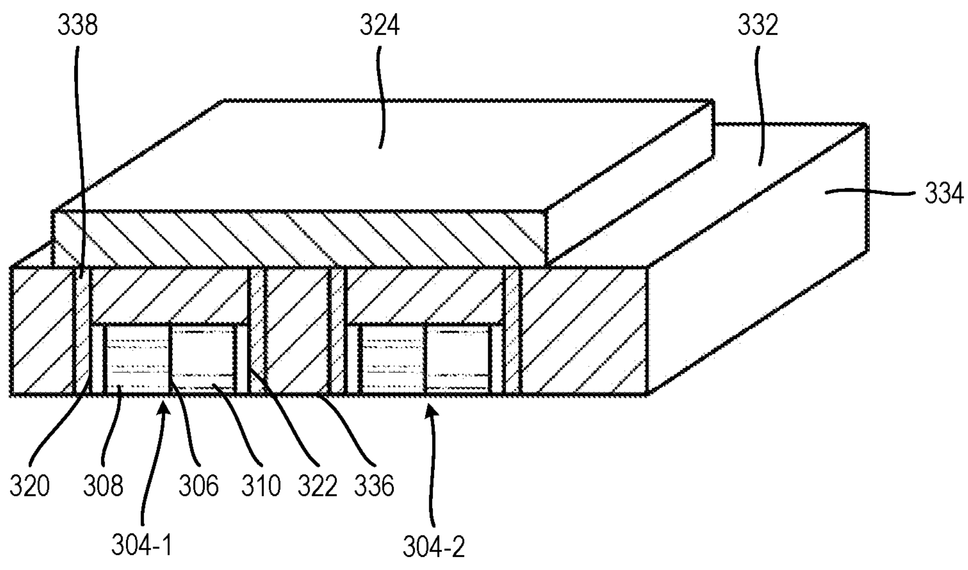
FIG. 3 is a perspective cross-sectional view of a processing unit with a plurality of electrochemical chambers, according to at least some embodiments of the present disclosure.

In some embodiments, a processor, active silicon, or other electrical load requires a plurality of electrochemical chambers to flow electrochemical fluid therethrough to provide a sufficient amount of electrical power and/or cooling through the substrate. FIG. 3 is a cross-sectional view of an embodiment of a processing unit including a processor 324 powered by a plurality of electrochemical chambers 304-1, 304-2 positioned locally on a substrate 334.

In some embodiments, each electrochemical chamber 304-1, 304-2 includes an ion-transfer membrane 306 dividing the electrochemical chamber 304-1, 304-2. Each electrochemical chamber 304-1, 304-2 includes a first electrochemical fluid 308 and a second electrochemical fluid 310 separated by the ion-transfer membrane 306. In some embodiments, ion-transfer across the ion-transfer membrane 306 between the first electrochemical fluid 308 and the second electrochemical fluid 310 produces an electric voltage and current to the processor 324 or other electrical load and discharges the first electrochemical fluid 308.

The electrical voltage and current is, in some embodiments, provided to the processor 324, active silicon, or other electrical load on the first surface 332 of the substrate 334 by TSVs 338. The TSVs 338 provide electrical communication from electrodes 320, 322 positioned in or adjacent to each electrochemical chamber 304-1, 304-2. For example, a first electrode 320 is positioned in or adjacent to the first electrochemical chamber 304-1 and configured to physically contact a first electrochemical fluid 308, and a second electrode 322 is positioned in or adjacent to the first electrochemical chamber 304-1 and configured to physically contact a second electrochemical fluid 310.

In some embodiments, each electrochemical chamber 304-1, 304-2 is configured as an elongated channel in the second surface 336 of the substrate 334. In such embodiments, the first electrochemical fluid 308 and second electrochemical fluid 310 flow through the electrochemical chamber 304 to transfer ions therebetween and provide electrical power via the electrodes 320, 322 in each electrochemical chamber 304-1, 304-2 and to absorb heat from the processor 324, active silicon, or other heat-generating component on the first surface 332 through the substrate 334.

Figure 4:
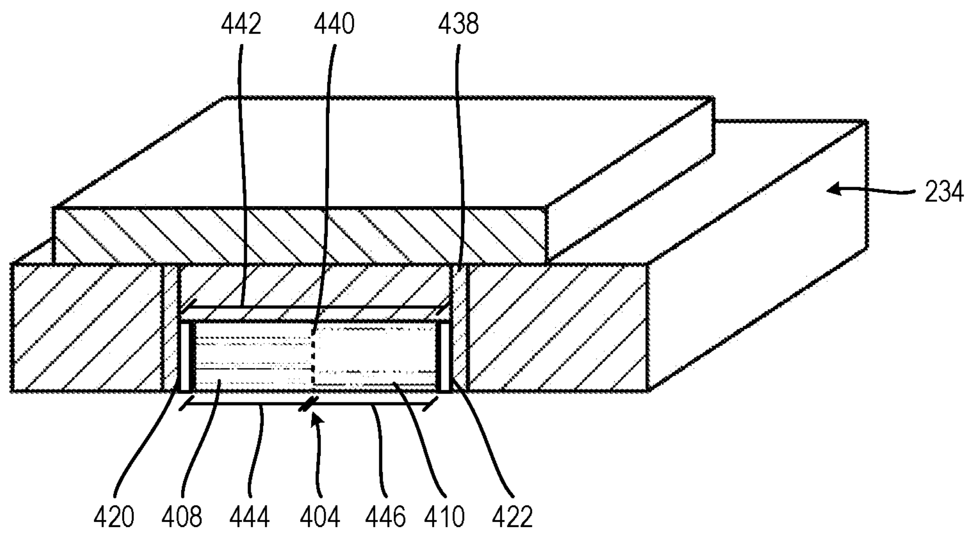
FIG. 4 is a perspective cross-sectional view of a processing unit with a membrane-less electrochemical chamber, according to at least some embodiments of the present disclosure.

FIG. 4 is a cross-sectional view of an embodiment of a processing unit including a processor 424 powered by an electrochemical chamber 404 without an ion-transfer membrane. While embodiments of electrochemical chambers herein have been described with an ion-transfer membrane dividing the electrochemical chambers into a first portion and a second portion configured to contain a first electrochemical fluid and a second electrochemical fluid, respectively, in some embodiments, a narrow electrochemical chamber or channel allow for the first electrochemical fluid 408 and the second electrochemical fluid 410 to flow through the electrochemical chamber 404 adjacent to and contacting one another with limited mixing therebetween.

The first electrochemical fluid 408 and second electrochemical fluid 410 in contact with one another at a boundary 440 transfer ions freely therebetween, producing an electrical current. The first electrode 420 and second electrode 422 positioned in or adjacent to the electrochemical chamber 404 provide the electrical power from the electrochemical fluids 408, 410 to the TSVs 438.

In some embodiments, the electrochemical chamber 404 has a chamber width 442 that is no more than 100 micrometers (μm). In some embodiments, the chamber width 442 is in a range having an upper value, a lower value, or upper and lower values including any of 5 μm, 6 μm, 7 μm, 8 μm, 9 μm, 10 μm, 15 μm, 20 μm, 30 μm, 50 μm, 75 μm, 100 μm, 500 μm or any values therebetween. For example, the chamber width 442 may be greater than 5 μm. In some examples, the chamber width 442 is less than 500 μm. In some examples, the chamber width 442 is between 5 μm and 100 μm. In some examples, the chamber width 442 is between 5 μm and 50 μm. In some examples, the chamber width 442 is between 10 μm and 40 μm.

In some embodiments, the first electrochemical fluid 408 and the second electrochemical fluid 410 flowing through the electrochemical chamber 404 define a first portion and a second portion, respectively, when no membrane is present. When a membrane is present, the first portion containing the first electrochemical fluid and the second portion containing the second electrochemical fluid are defined by the membrane. In some embodiments, the first portion has a first portion width 444 and the second portion has a second portion width 446 that are equal to one another. In some examples, the first portion and second portion have cross-sectional areas that are equal.

In some embodiments, the first portion width 444 and the second portion width 446 are different from one another. For example, the first portion width 444 may be greater than the second portion width 446 or the second portion width 446 may be greater than the first portion width 444. In some embodiments, the first portion width 444 is in a range having an upper value, a lower value, or upper and lower values including any of 1 μm, 2 μm, 3 μm, 4 μm, 5 μm, 6 μm, 7 μm, 8 μm, 9 μm, 10 μm, 15 μm, 20 μm, 30 μm, 50 μm, or any values therebetween. For example, the first portion width 444 may be greater than 1 μm. In some examples, the first portion width 444 is less than 50 μm. In some examples, the first portion width 444 is between 1 μm and 50 μm. In some examples, the first portion width 444 is between 1 μm and 25 μm. In some examples, the first portion width 444 is between 2.5 μm and 20 μm.

In some embodiments, the second portion width 446 is in a range having an upper value, a lower value, or upper and lower values including any of 1 μm, 2 μm, 3 μm, 4 μm, 5 μm, 6 μm, 7 μm, 8 μm, 9 μm, 10 μm, 15 μm, 20 μm, 30 μm, 50 μm, or any values therebetween. For example, the second portion width 446 may be greater than 1 μm. In some examples, the second portion width 446 is less than 50 μm. In some examples, the second portion width 446 is between 1 μm and 50 μm. In some examples, the second portion width 446 is between 1 μm and 25 μm. In some examples, the second portion width 446 is between 2.5 μm and 20 μm.

Figure 5:
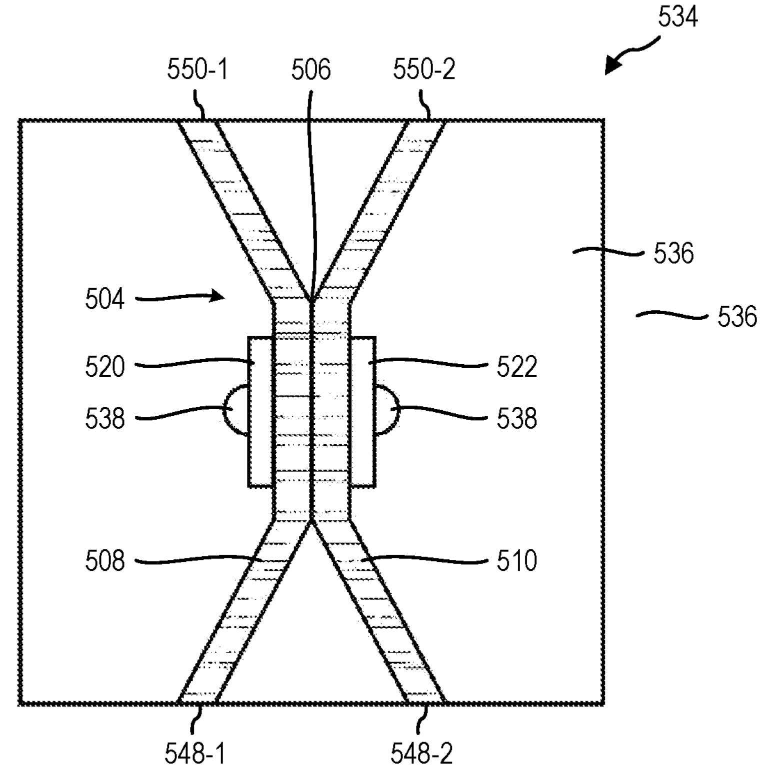
FIG. 5 is a bottom view of a substrate with an electrochemical chamber therein, according to at least some embodiments of the present disclosure.

As described herein, the electrochemical chamber is, in some embodiments, an elongated channel through which the electrochemical fluid(s) flow to provide a substantially continuous supply of cool and charged electrochemical fluid(s). FIG. 5 is a bottom view of an embodiment of a silicon substrate 534 with an electrochemical chamber 504 located in a second surface 536 (e.g., bottom surface) thereof. The electrochemical chamber 504 is an elongated channel separated by a ion-transfer membrane 506. The first portion of the electrochemical chamber 504 contains a first electrochemical fluid 508 and the second portion of the electrochemical chamber 504 contains a second electrochemical fluid 510.

In some embodiments, the first electrode 520 and the second electrode 522 are positioned adjacent to the first portion and the second portion of the electrochemical chamber 504 to receive charge from the first electrochemical fluid 508 and the second electrochemical fluid 510, respectively. In some embodiments, the first electrode 520 and the second electrode 522 are each in electrical communication with a TSV 538 (oriented vertically into the substrate 534). In some embodiments, the electrochemical chamber 504 includes one electrode 520, 522 for each of the first electrochemical fluid 508 and the second electrochemical fluid 510. In some embodiments, the electrochemical chamber 504 includes a plurality of electrodes 520, 522 for each of the first electrochemical fluid 508 and the second electrochemical fluid 510.

In some embodiments, the electrochemical chamber 504 has the same quantity of first electrodes 520 and second electrodes 522 to provide an equal contact area for charge collection. In some embodiments, the electrochemical chamber 504 has a different quantity of first electrodes 520 and second electrodes 522 based on a shape or surface area of the electrochemical chamber 504. For example, an asymmetrical electrochemical chamber 504 and/or an electrochemical chamber including different volumes of first electrochemical fluid 508 and second electrochemical fluid 510 may have different quantities or sizes of electrodes.

In some embodiments, a first electrode 520 (or plurality of first electrodes 520) has an equal length to the second electrode 522 (or plurality of first electrodes 522) in the direction of flow of the electrochemical fluids 508, 510. In some embodiments, the electrochemical chamber 504 has a different length of first electrodes 520 (or plurality of first electrodes 520) and second electrodes 522 (or plurality of second electrodes 522) based on a shape or surface area of the electrochemical chamber 504. For example, an asymmetrical electrochemical chamber 504 and/or an electrochemical chamber including different volumes of first electrochemical fluid 508 and second electrochemical fluid 510 may have different lengths of electrodes.

In some embodiments, a first electrode 520 (or plurality of first electrodes 520) has an equal area to the second electrode 522 (or plurality of first electrodes 522). In some embodiments, the electrochemical chamber 504 has a different area of first electrodes 520 (or plurality of first electrodes 520) and second electrodes 522 (or plurality of second electrodes 522) based on a shape or surface area of the electrochemical chamber 504. For example, an asymmetrical electrochemical chamber 504 and/or an electrochemical chamber including different volumes of first electrochemical fluid 508 and second electrochemical fluid 510 may have different areas of electrodes.

The amount of power generated by the electrochemical fluids 508, 510 at the electrodes 520, 522 may be at least partially dependent on the quantity of charge of the electrochemical fluids 508, 510. An increase in flowrate through the channel(s) of the electrochemical chamber 504 may affect the available ions transferrable between the electrochemical fluids 508, 510 and increase the available electrical power in the electrochemical chamber 504. In some embodiments, the first electrochemical fluid 508 and the second electrochemical fluid 510 have a similar or substantially equal flowrate through the electrochemical chamber 504. For example, the flowrate in volume per second (e.g., milliliters per second) through the electrochemical chamber 504 may be substantially equal between the first electrochemical fluid 508 and the second electrochemical fluid 510. In some embodiments, the first electrochemical fluid 508 and the second electrochemical fluid 510 have a different flowrates through the electrochemical chamber 504. In at least one embodiment, a pump (such as described in relation to FIGS. 1-1 and 1-2) may vary a first flowrate of the first electrochemical fluid 508 and/or a second flowrate of the second electrochemical fluid 510 independently of one another.

In some embodiments, the total thermal management capacity of the electrochemical fluids 508, 510 in the electrochemical chamber 504 is at least partially related to a flowrate of the electrochemical fluids 508, 510 through the electrochemical chamber 504. An increase in flowrate through the channel(s) of the electrochemical chamber 504 may affect the temperature difference between the electrochemical fluids 508, 510 and the surfaces of the electrochemical chamber 504 from which the electrochemical fluids 508, 510 receive heat from the substrate 534. In some examples, an increase in flowrate through the channel(s) of the electrochemical chamber 504 may increase the mass of electrochemical fluids 508, 510 flowing through the electrochemical chamber 504, allowing the electrochemical fluids 508, 510 to exhaust more heat from the substrate 534.

As described above, in some embodiments, the first electrochemical fluid 508 and the second electrochemical fluid 510 have a similar or substantially equal flowrate through the electrochemical chamber 504. For example, the flowrate in volume per second (e.g., milliliters per second) through the electrochemical chamber 504 may be substantially equal between the first electrochemical fluid 508 and the second electrochemical fluid 510. In some embodiments, the first electrochemical fluid 508 and the second electrochemical fluid 510 have a different flowrates through the electrochemical chamber 504. In at least one embodiment, a pump (such as described in relation to FIGS. 1-1 and 1-2) may vary a first flowrate of the first electrochemical fluid 508 and/or a second flowrate of the second electrochemical fluid 510 independently of one another.

The electrochemical fluids 508, 510 may be directed into or towards the electrochemical chamber 504 through one or more inlets 548-1, 548-2 of the substrate 534. In some embodiments, a first electrochemical fluid 508 is directed into or towards the electrochemical chamber 504 through a first inlet 548-1. In some embodiments, a second electrochemical fluid 508 is directed into or towards the electrochemical chamber 504 through a second inlet 548-1. In some embodiments, the first electrochemical fluid 508 and second electrochemical fluid 510 are both directed into or towards the electrochemical chamber 504 at a shared inlet.

The electrochemical fluids 508, 510 may be directed out of or away from the electrochemical chamber 504 through one or more outlets 550-1, 550-2 of the substrate 534. In some embodiments, a first electrochemical fluid 508 is directed out of or away from the electrochemical chamber 504 through a first outlet 550-1. In some embodiments, a second electrochemical fluid 508 is directed out of or away from the electrochemical chamber 504 through a second outlet 550-1. In some embodiments, the first electrochemical fluid 508 and second electrochemical fluid 510 are both directed out of or away from the electrochemical chamber 504 at a shared outlet.

In the embodiment illustrated in FIG. 5, the first electrochemical fluid 508 and the second electrochemical fluid 510 enter the channels of the substrate 534 at a first inlet 548-1 and a second inlet 548-2, respectively, that are located on the same edge of the substrate 534. The first electrochemical fluid 508 and the second electrochemical fluid 510 flow through the electrochemical chamber 504 in cocurrent flow. Cocurrent flow may allow the electrochemical fluids 508, 510 to transfer electrical charge therebetween and/or receive heat from the substrate 534 with a greatest charge difference and/or temperature difference proximate the inlets 548-1, 548-2 and less proximate the outlets 550-1, 550-2.

In some embodiments, the first inlet 548-1 and second inlet 548-2 are located on opposite edges of the substrate and/or the first electrochemical fluid 508 and the second electrochemical fluid 510 flow through the electrochemical chamber 504 in countercurrent flow. Countercurrent flow may allow the electrochemical fluids 508, 510 to transfer electrical charge therebetween and/or receive heat from the substrate 534 with a substantially uniform transfer rate therebetween and/or a more uniform transfer rate compared to cocurrent flow.

Figure 6:
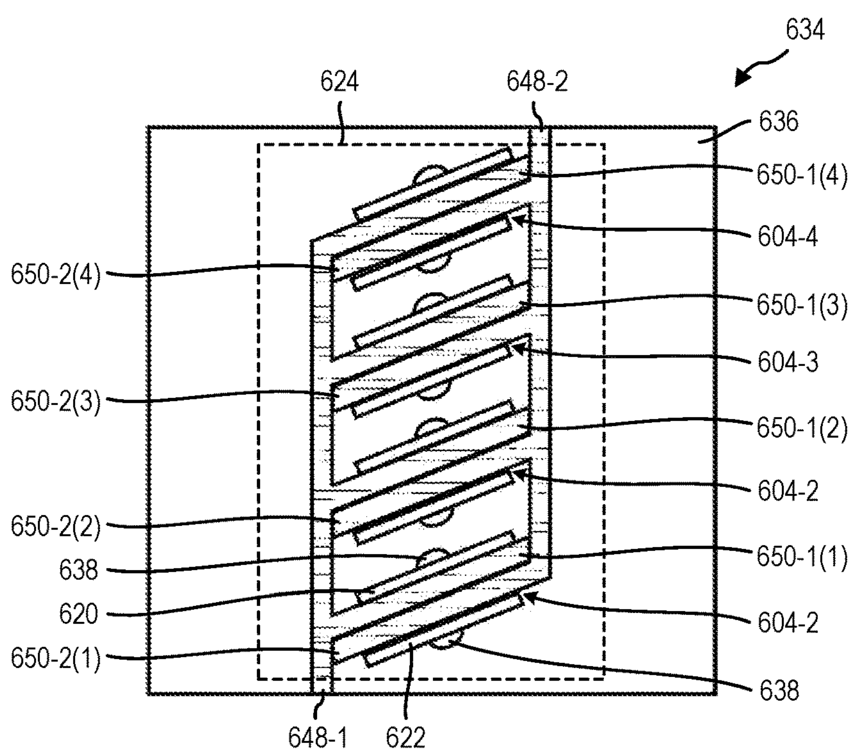
FIG. 6 is a bottom view of a substrate with electrochemical chambers exhibiting countercurrent flow, according to at least some embodiments of the present disclosure.

FIG. 6 is a bottom view of an embodiment of a silicon substrate 634 with a plurality of branching channels that form a plurality of electrochemical chambers with countercurrent flow. It should be understood that, in other embodiments with a plurality of electrochemical chambers and/or branching channels, the electrochemical fluids flow with cocurrent flow. In some embodiments, a processor 624 or other electrical load and heat-generating component has a footprint that is larger than a single electrochemical chamber can supply electrical power to and remove heat from. In some embodiments, a substrate 634 has a plurality of electrochemical chambers 604-1, 604-2, 604-3, 604-4 to supply electrical power to the processor 624 through a plurality of electrodes 620, 622 and TSVs 638 through the substrate 634. In some embodiments, the substrate 634 includes a first inlet 648-1 for the first electrochemical fluid 608 and a second inlet 648-2 for the second electrochemical fluid 610 located at opposite edges of the second surface 636 of the substrate 634. In other embodiments, the inlets 648-1, 648-2 are located and/or oriented at other positions relative to one another to facilitate countercurrent flow and/or a plurality of electrochemical chambers 604-1, 604-2, 604-3, 604-4.

In some embodiments, each of the electrochemical chambers 604-1, 604-2, 604-3, 604-4 that includes both the first electrochemical fluid 608 and the second electrochemical fluid 610 have a first electrode 620 and a second electrode 622 to receive charge from ion transfer between the electrochemical fluids 608, 610. In some embodiments, the electrochemical chambers 604-1, 604-2, 604-3, 604-4 are divided by an ion-transfer membrane 606. Embodiments utilizing countercurrent flow may exhibit too much turbulence for a membrane-less boundary.

In some embodiments, each of the first electrochemical fluid 608 and the second electrochemical fluid 610 enter the substrate 634 through inlets 648-1, 648-2. In some embodiments, the first electrochemical fluid 608 exits the substrate 634 through outlets 650-1(1), 650-1(2), 650-1(3), 650-1(4) associated with each of the electrochemical chambers 604-1, 604-2, 604-3, 604-4, respectively. In some embodiments, the second electrochemical fluid 610 exits the substrate 634 through outlets 650-2(1), 650-2(2), 650-2(3), 650-2(4) associated with each of the electrochemical chambers 604-1, 604-2, 604-3, 604-4, respectively. In some embodiments, at least one of the first electrochemical fluid 608 and the second electrochemical fluid 610 flows from the electrochemical chambers 604-1, 604-2, 604-3, 604-4 into a combined channel before exiting the substrate 634. By branching the flow of the first electrochemical fluid 608 and the second electrochemical fluid 610 into a plurality of electrochemical chambers 604, in some embodiments, electrical power and thermal management can be better distributed across the footprint of the processor 624 than a single electrochemical chamber alone.

Figure 7:
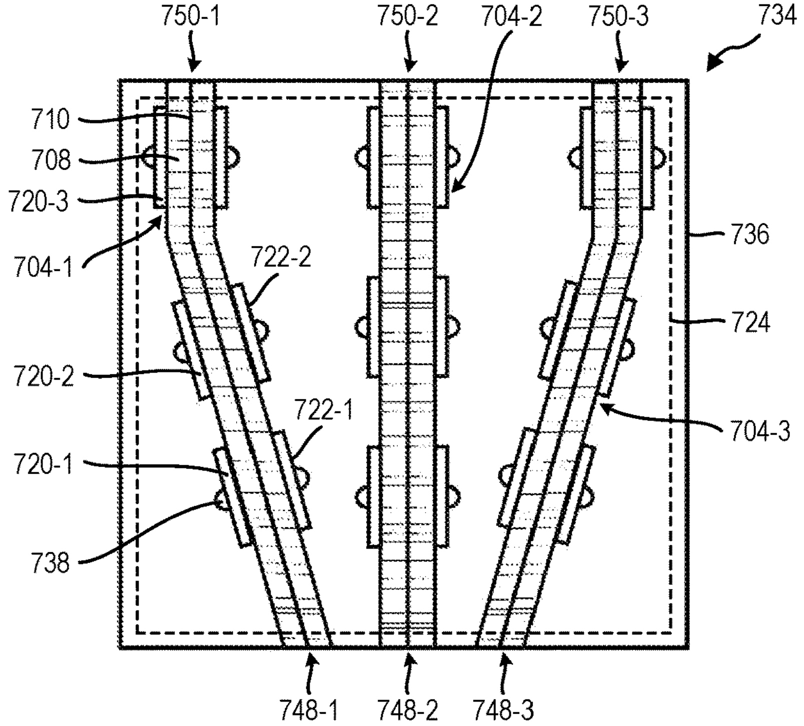
FIG. 7 is a bottom view of a substrate with non-parallel electrochemical chambers, according to at least some embodiments of the present disclosure.

While a substrate with parallel electrochemical chambers 604-1, 604-2, 604-3, 604-4 is described in relation to FIG. 6, in other embodiments, electrochemical chambers are oriented at a diverging or converging (e.g., non-parallel) angle to one another. FIG. 7 is a bottom view of an embodiment of a silicon substrate 734 with a plurality of diverging electrochemical chambers 704-1, 704-2, 704-3. In some embodiments, a substrate 734 has a plurality of electrochemical chambers 704-1, 704-2, 704-3 positioned in a second surface 736 opposite a processor 724 or other electrical load/heat-generating component. Depending on the architecture of the processor 724 or other electrical load/heat-generating component, different regions of the processor 724 or other electrical load/heat-generating component require different amounts of electrical power and/or thermal management through the substrate 734.

In some embodiments, the electrochemical chambers 704-1, 704-2, 704-3 are positioned in the substrate 734 to position electrodes 720, 722 and TSVs 738 where the processor 724 or other electrical load/heat-generating component architecture needs electrical power. In some embodiments, the electrochemical chambers 704-1, 704-2, 704-3 are positioned in the substrate 734 to position electrodes 720, 722 and TSVs 738 where the processor 724 or other electrical load/heat-generating component architecture needs electrical power.

In some embodiments, at least one of the electrochemical chambers 704-1, 704-2, 704-3 includes a plurality of sets of electrodes 720-1, 722-1, 720-2, 722-2, 720-3, 722-3. Each set of electrodes is in electrical communication with a TSV 738 to deliver electrical power to a portion of the processor 724 or other electrical load/heat-generating component. In some embodiments, a first set of electrodes 720-1, 722-1 of an electrochemical chamber 704-1 is positioned proximate a higher power consumption region of the processor 724 or other electrical load/heat-generating component. For example, the available charge in the electrochemical fluids 708, 710 may decrease in a flow direction through the electrochemical chamber 704-1, and positioning a first set of electrodes 720-1, 722-1 of an electrochemical chamber 704-1 proximate an inlet 748-1 may allow a greater power production at the first set of electrodes 720-1, 722-1 and allow a greater thermal management of the high power consumption region of the processor 724 or other electrical load/heat-generating component because the electrochemical fluids 708, 710 are cooler proximate the inlet 748-1 relative to the outlet 750-1.

In some embodiments, the substrate 734 includes a plurality of inlets 748-1, 748-2, 748-3 and a plurality of outlets 750-1, 750-2, 750-3. In at least one embodiment, the substrate 734 includes at least one inlet and at least one outlet for each of the electrochemical chambers 704-1, 704-2, 704-3.

Figure 8:
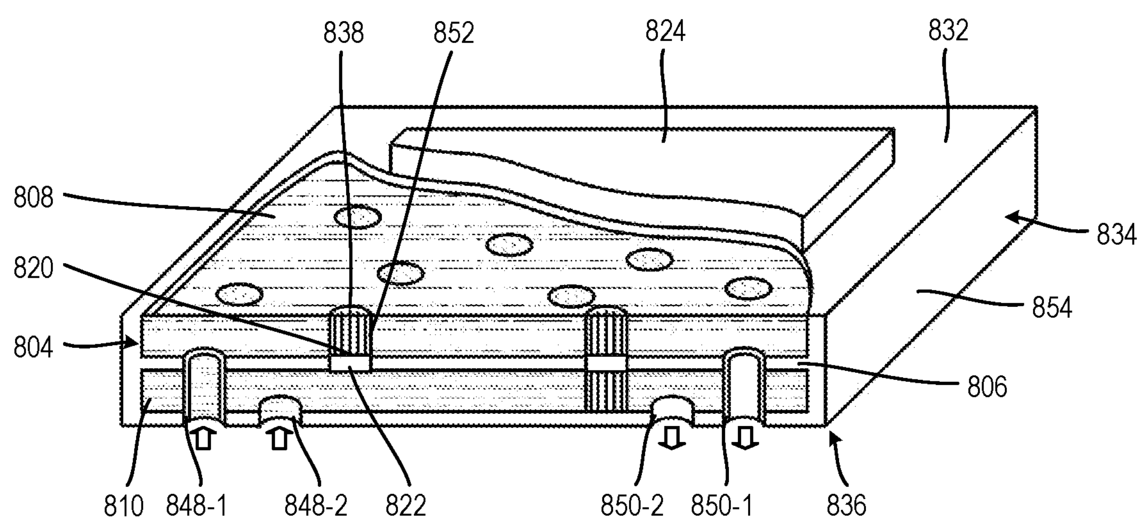
FIG. 8 is a perspective partial cutaway view of a processing unit with a layered electrochemical chamber, according to at least some embodiments of the present disclosure.

FIG. 8 is a bottom perspective cross-sectional view of an embodiment of a silicon substrate 834 with a large-area electrochemical chamber 804. Embodiments of electrochemical chambers have been described herein with relation to a first electrochemical fluid and a second electrochemical fluid positioned in a first portion and second portion of the electrochemical chamber laterally adjacent to one another. In some embodiments, the first portion of the electrochemical chamber 804 (containing a first electrochemical fluid

808) and the second portion of the electrochemical chamber 804 (containing a second electrochemical fluid 810) are layered in substantially planar layers divided by an ion-transfer membrane 806 therebetween. For example, the first portion and the second portion are layered in a direction perpendicular to a first surface 832 and/or second surface 836 of the substrate 834. In at least one example, a plane of the ion-transfer membrane 806 is substantially parallel to the first surface 832 and/or second surface 836 of the substrate 834.

In some embodiments, a first inlet 848-1 provides fluid flow of the first electrochemical fluid 808 into the first portion of the electrochemical chamber 804. In some embodiments, a second inlet 848-2 provides fluid flow of the second electrochemical fluid 810 into the second portion of the electrochemical chamber 804. The first electrochemical fluid 808 and second electrochemical fluid 810 exchange ions across the ion-transfer membrane 806, and the resulting charge is collected at the electrodes 820, 822.

In some embodiments, the electrodes 820, 822 are electrically connected to TSVs 838. The TSVs 838 provide the electrical power to the processor 824 or other electrical load/heat-generating component. In some embodiments, the TSVs 838 are positioned in and/or supported by pin fins 852. In some embodiments, the pin fins 852 are continuous through a full height of the electrochemical chamber 804 (e.g., continuous between a first surface 832 of the substrate and the second surface 836 of the substrate 834) and provide support to the substrate 834 and/or the ion-transfer membrane 806 in the electrochemical chamber 804. In some embodiments, a pin fin 852 is positioned through a portion of the electrochemical chamber 804 less than a full height of the electrochemical chamber 804 to provide support to the TSVs 838 while reducing the fluidic drag on the electrochemical fluids 808, 810.

The first electrochemical fluid 808 and second electrochemical fluid 810 flow out of the electrochemical chamber 804 (the first portion and second portion, respectively) through outlets 850-1, 850-2. In some embodiments, the inlets 848-1, 848-2 and outlets 850-1, 850-2 are positioned relative to one another in the electrochemical chamber 804 to direct and control flow of the first electrochemical fluid 808 and second electrochemical fluid 810, therethrough. For example, inlets 848-1, 848-2 and outlets 850-1, 850-2 may be positioned to control electrochemical fluid flow through the electrochemical chamber 804 as needed for electrical power generation and/or thermal management.

While the inlets 848-1, 848-2 and outlets 850-1, 850-2 are illustrated on a second surface 836 of the substrate 834, in some embodiments, inlets 848-1, 848-2 and/or outlets 850-1, 850-2 are on the lateral surface 854 of the substrate 834.

Figure 9:
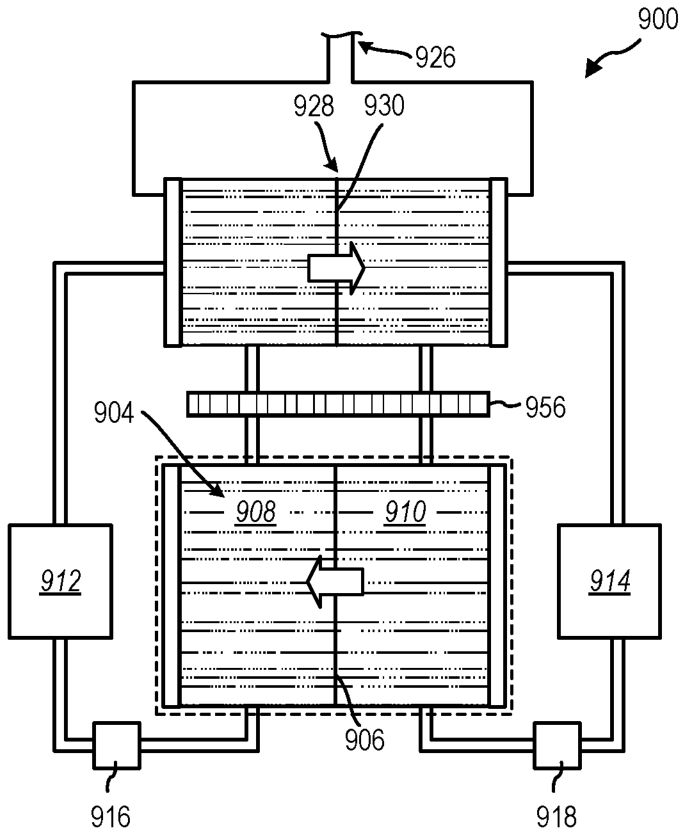
FIG. 9 is a schematic representation of an electrochemical power generation system with a heat exchanger, according to at least some embodiments of the present disclosure.

FIG. 9 is a schematic representation of an embodiment of an electrochemical system including a heat exchanger to reject heat from the electrochemical fluid(s) and cool the electrochemical chamber. In some embodiments, an electrochemical generator system 900 includes a first electrochemical chamber 904 configured to discharge an electrochemical fluid 908, 910 and provide an electrical power to an electrical load (e.g., the processor 924 or other electrical load and/or heat-generating component), and the electrochemical generator system 900 includes a second electrochemical chamber 928 configured to receive electrical power from an electrical source 926 (e.g., a power grid or other power source) to recharge the electrochemical fluid 908, 910.

In some embodiments, the electrochemical fluid 908, 910 circulates through the electrochemical generator system 900, receiving electrical power from the electrical source 926 and delivering the electrical power to the electrical load, substantially continuously. In some embodiments, the electrochemical fluid is stored in a storage tank 912, 914 until the electrical power is needed similarly to a battery, when pumps 916, 918 flow the electrochemical fluid 908, 910. A first electrochemical fluid 908 and a second electrochemical fluid 910 exchange ions across a first ion-transfer membrane 906 in the first electrochemical chamber 904 to discharge the first electrochemical fluid 908 and produce electrical power. The first electrochemical fluid 908 and a second electrochemical fluid 910 exchange ions across a second ion-transfer membrane 930 in the second electrochemical chamber 928 to charge the first electrochemical fluid 908 and store electrical power.

In some embodiments, at least a part of the electrochemical chamber configured to provide power is located in a microfluidic volume substrate 934 as illustrated and described in relation to any of FIG. 2 through FIG. 8. For example, a first electrochemical fluid may be positioned in the microfluidic volume. In another example, a second electrochemical fluid may be positioned in the microfluidic volume. In yet another example, both the first electrochemical fluid and the second electrochemical fluid may be positioned in the microfluidic volume.

The first electrochemical fluid 908 and second electrochemical fluid 910 may receive heat from the processor 924 or other electrical load and/or heat-generating component of the electrochemical generator system 900. The first electrochemical fluid 908 and second electrochemical fluid 910 may flow from the processor 924 or other electrical load and/or heat-generating component to the heat exchanger 956 and exhaust at least a portion of the heat from the first electrochemical fluid 908 and second electrochemical fluid 910. The first electrochemical fluid 908 and second electrochemical fluid 910 can thereby provide electrical power directly to the processor 924 and remove heat from the processor 924 in a single medium passing through the microfluidic volume of the processor 924.

Figure 10:
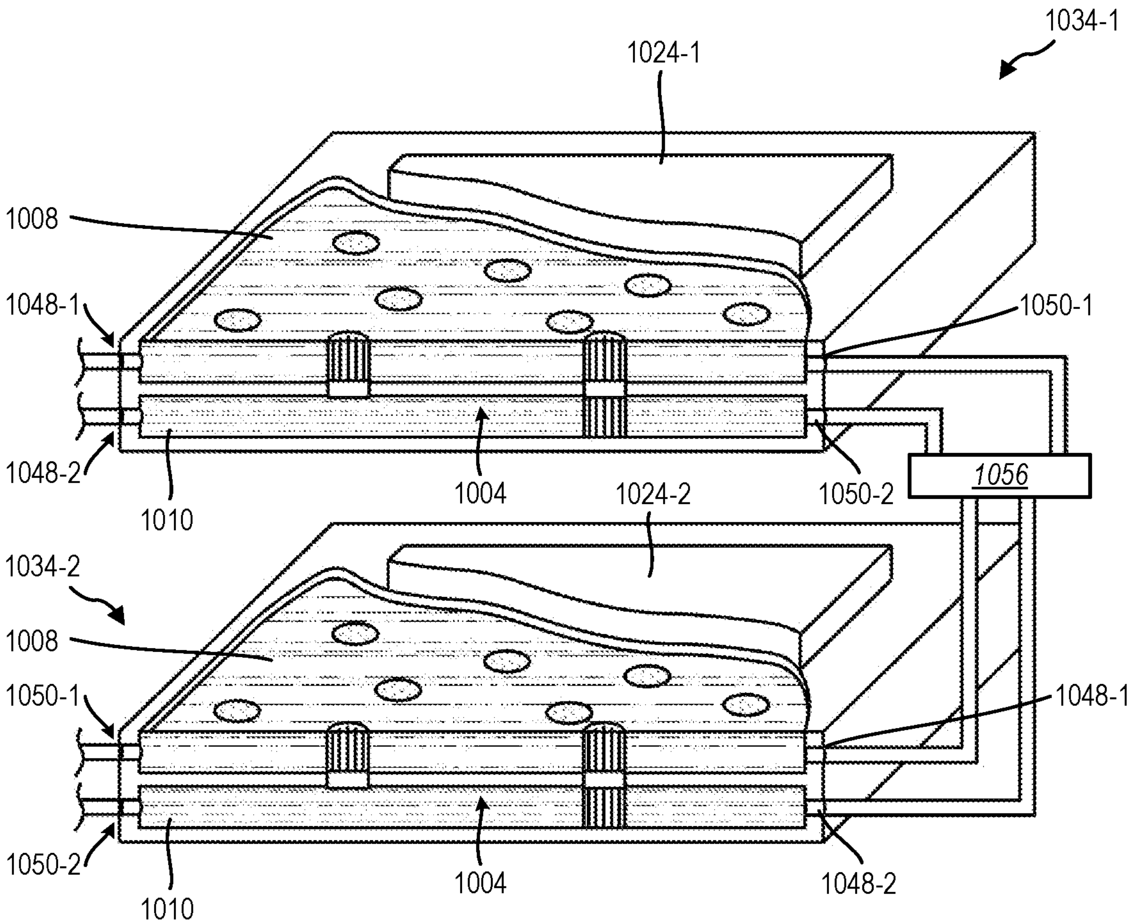
FIG. 10 is a perspective partial cutaway view of a plurality of processing units with a layered electrochemical chamber in fluid communication by a heat exchanger, according to at least some embodiments of the present disclosure.

FIG. 10 is a side view of a processor 1024-1 or other electrical load and/or heat-generating component with a heat exchanger 1056 for the first electrochemical fluid 1008 and the second electrochemical fluid 1010 before the first electrochemical fluid 1008 and the second electrochemical fluid 1010 are directed to lower power consumption processor 1024-2 or other electrical load and/or heat-generating component.

In some embodiments, the first electrochemical fluid 1008 is received through a first inlet 1048-1 of a first substrate 1034-1 that supports a first processor 1024-1 or other electrical load and/or heat-generating component and a second electrochemical fluid 1010 is received through a second inlet 1048-2 of the first substrate 1034-1. The first electrochemical fluid 1008 and the second electrochemical fluid 1010 flow through the electrochemical chamber 1004, as described herein such as in relation to FIG. 2 through FIG. 8. In some embodiments, the first electrochemical fluid 1008 and the second electrochemical fluid 1010 receive heat from the processor 1024-1 or other electrical load and/or heat-generating component through the substrate 1034. The first electrochemical fluid 1008 and the second electrochemical fluid 1010 have a higher temperature at the first outlet 1050-1 and the second outlet 1050-2, compared to the temperature at the first inlet 1048-1 and the second inlet 1048-2, respectively.

In some embodiments, the first electrochemical fluid 1008 and the second electrochemical fluid 1010 are directed from the first outlet 1050-1 and the second outlet 1050-2 to a second substrate 1034-2 that supports a second processor 1024-2 or other electrical load and/or heat-generating component to power and/or cool the second processor 1024-2 or other electrical load and/or heat-generating component.

In some embodiments, the second processor 1024-2 or other electrical load and/or heat-generating component is a lower power consumption component compared to the first processor 1024-1 or other electrical load and/or heat-generating component, and the remaining charge in the first electrochemical fluid 1008 and the second electrochemical fluid 1010 is used to power the second processor 1024-2 or other electrical load and/or heat-generating component. However, the first electrochemical fluid 1008 and the second electrochemical fluid 1010 are at an elevated temperature after receiving heat from the first processor 1024-1 or other electrical load and/or heat-generating component.

In at least one embodiment, the first electrochemical fluid 1008 and the second electrochemical fluid 1010 are cooled before entering the second substrate 1034-2 at the inlets 1048-1, 1048-2 of the second substrate 1034-2. The first electrochemical fluid 1008 and the second electrochemical fluid 1010 flow to and through a heat exchanger 1056. The heat exchanger 1056 exhausts heat from the first electrochemical fluid 1008 and the second electrochemical fluid 1010 to ambient air or to another fluid that exhausts the heat. The cooled first electrochemical fluid 1008 and the second electrochemical fluid 1010 flow from the heat exchanger 1056 to the electrochemical chamber 1004 of the second substrate 1034-2 to provide power and further cooling to the second processor 1024-2 or other electrical load and/or heat-generating component before exiting the electrochemical chamber 1004 of the second substrate 1034-2 through the outlets 1050-1, 1050-2. The first electrochemical fluid 1008 and the second electrochemical fluid 1010, in some embodiments, are further cooled and recharged, such as described in relation to FIG. 9.

In some embodiments, and particularly in the layer embodiment of an electrochemical chamber described in relation to FIG. 8 and FIG. 10, the first electrochemical fluid and second electrochemical fluid receive different amounts of heat through the substrate and/or change temperature by a different amount. For example, the first electrochemical fluid 1008 is positioned closer to the processor 1024-1, 1024-2 or other electrical load and/or heat-generating component and may receive more heat. In some examples, such as when the first electrochemical fluid 1008 and the second electrochemical fluid 1010 are laterally adjacent one another in the electrochemical chamber, such as described in relation to FIG. 2 through FIG. 7, the first electrochemical fluid 1008 and the second electrochemical fluid 1010 may receive the same amount of heat but change temperature by different amounts due to different heat capacities of the first electrochemical fluid 1008 and the second electrochemical fluid 1010.

Figure 11:
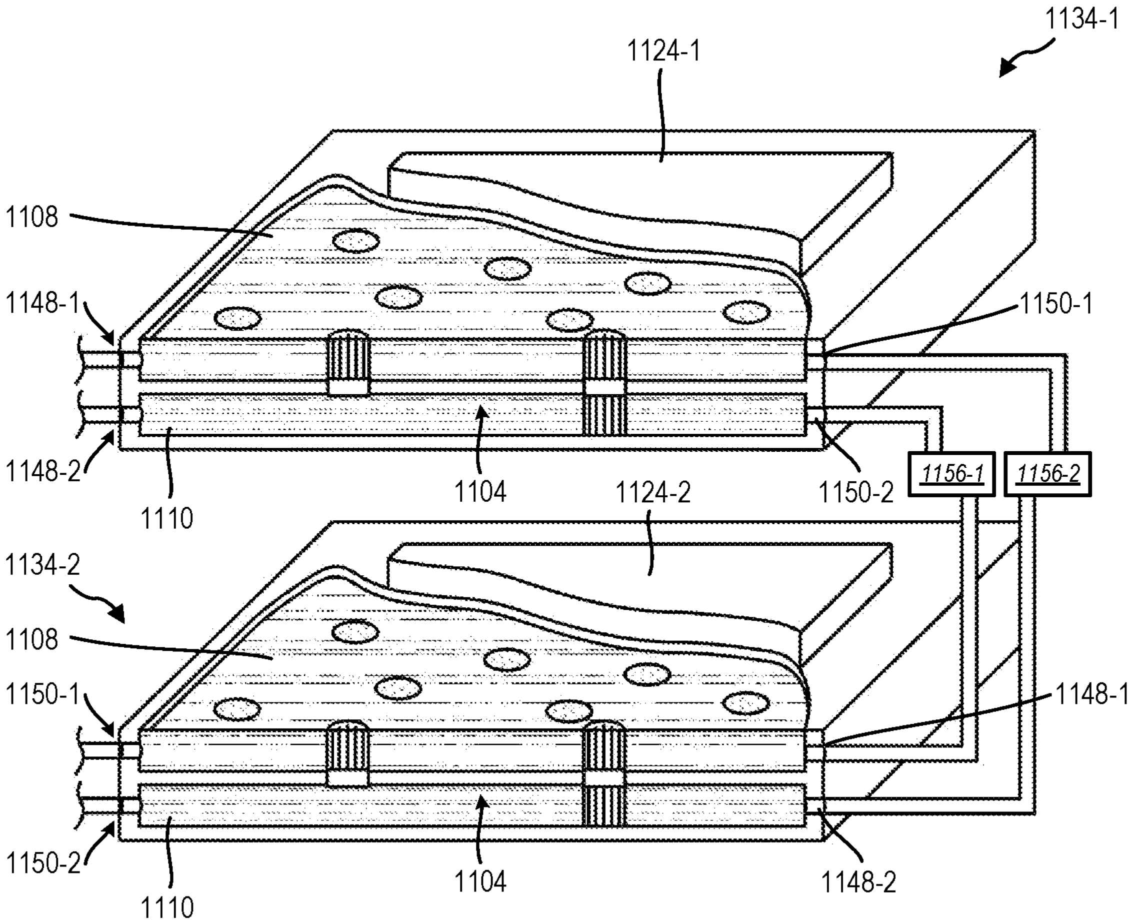
FIG. 11 is a perspective partial cutaway view of a plurality of processing units with a layered electrochemical chamber in fluid communication by a plurality of heat exchangers, according to at least some embodiments of the present disclosure.

FIG. 11 is a schematic side view of a portion of a system with individual heat exchangers 1156-1, 1156-2 for the first electrochemical fluid 1108 and the second electrochemical fluid 1110, respectively. In some embodiments, the first electrochemical fluid 1108 is received through a first inlet 1148-1 of a first substrate 1134-1 that supports a first processor 1124-1 or other electrical load and/or heat-generating component and a second electrochemical fluid 1110 is received through a second inlet 1148-2 of the first substrate 1134-1. The first electrochemical fluid 1108 and the second electrochemical fluid 1110 flow through the electrochemical chamber 1104, as described herein such as in relation to FIG. 2 through FIG. 8. In some embodiments, the first electrochemical fluid 1008 and the second electrochemical fluid 1110 receive different amounts of heat from the processor 1124-1 or other electrical load and/or heat-generating component through the substrate 1134. The first electrochemical fluid 1108 and the second electrochemical fluid 1110 have a higher temperature at the first outlet 1150-1 and the second outlet 1150-2, compared to the temperature at the first inlet 1148-1 and the second inlet 1148-2, respectively, with the first electrochemical fluid 1108 increasing in temperature more than the second electrochemical fluid 1110.

In some embodiments, the first electrochemical fluid 1108 and the second electrochemical fluid 1110 are directed from the first outlet 1150-1 and the second outlet 1150-2 to a second substrate 1134-2 that supports a second processor 1124-2 or other electrical load and/or heat-generating component to power and/or cool the second processor 1124-2 or other electrical load and/or heat-generating component.

In some embodiments, the second processor 1124-2 or other electrical load and/or heat-generating component is a lower power consumption component compared to the first processor 1124-1 or other electrical load and/or heat-generating component, and the remaining charge in the first electrochemical fluid 1108 and the second electrochemical fluid 1110 is used to power the second processor 1124-2 or other electrical load and/or heat-generating component. However, the first electrochemical fluid 1108 and the second electrochemical fluid 1110 are at an elevated temperature after receiving heat from the first processor 1124-1 or other electrical load and/or heat-generating component.

In at least one embodiment, the first electrochemical fluid 1108 and the second electrochemical fluid 1110 are cooled before entering the second substrate 1134-2 at the inlets 1148-1, 1148-2 of the second substrate 1134-2. The first electrochemical fluid 1108 flows to and through a first heat exchanger 1156-1 and the second electrochemical fluid 1110 flows to and through a second heat exchanger 1156-2. The heat exchangers 1156-1, 1156-2 exhaust heat from the first electrochemical fluid 1108 and the second electrochemical fluid 1110 to ambient air or to another fluid that exhausts the heat. In some embodiments, the heat exchangers 1156-1, 1156-2 cool the first electrochemical fluid 1108 and the second electrochemical fluid 1110 by different amounts. In some embodiments, the heat exchangers 1156-1, 1156-2 cool the first electrochemical fluid 1108 and the second electrochemical fluid 1110 to the same temperature.

The cooled first electrochemical fluid 1108 and the second electrochemical fluid 1110 flow from the heat exchangers 1156-1, 1156-2 to the electrochemical chamber 1104 of the second substrate 1134-2 to provide power and further cooling to the second processor 1124-2 or other electrical load and/or heat-generating component before exiting the electrochemical chamber 1104 of the second substrate 1134-2 through the outlets 1150-1, 1150-2. The first electrochemical fluid 1108 and the second electrochemical fluid 1110, in some embodiments, are further cooled and recharged, such as described in relation to FIG. 9.

Recirculating the recharged and cooled electrochemical fluid can allow the electrochemical fluid to provide electrical power and thermal management directly to the dies of a processor substantially continuously. In at least one embodiment, delivery of electrochemical fluid to the microfluidic volume of a processor can allow combined power delivery and thermal management and allow for smaller, more powerful, more efficient, and more reliable processors.

INDUSTRIAL APPLICABILITY

The present disclosure generally relates to systems and methods for providing electrical power and thermal management to a processor. More particularly, the present disclosure relates to power generation using an electrochemical fluid in a microfluidic volume of a processor or other heat-generating electronic component with heat exhausted from the microfluidic volume by the electrochemical fluid. In some embodiments, at least a portion of an electrochemical flow battery and/or generator is located in the microfluidic volume of an inactive silicon or other substrate wafer of the processor or other heat-generating electronic component. For example, an electrochemical fluid, such as an anolyte or catholyte, flows into the microfluidic volume such that an electrical voltage and current is produced in the microfluidic volume from the electrochemical fluid to power the processor. The electrical power is provided to the processor by electrical communication from the microfluidic volume by through silicon vias (TSVs) positioned in the wafer. The electrochemical fluid receives heat from the processor or other heat-generating electronic component, and the electrochemical fluid flows out of the microfluidic volume to exhaust heat from the processor or other heat-generating electronic component.

In some embodiments, a heat-generating component according to the present disclosure includes a processor or processing device. In some embodiments, the heat-generating component is a generalized processing device, such as a central processing unit (CPU) or graphical processing unit (GPU); a specialized device application-specific integrating circuit (ASIC); a memory module (such as cache memory, volatile memory, or non-volatile memory); or other electronic or processing components. The heat-generating component generates heat during use.

In a conventional processor, a die is connected to a printed circuit board (PCB), which delivers electrical power to the die via one or more wire traces. The delivery of electrical power through the wire traces can be inefficient from an electrical standpoint and/or a design space standpoint. Further, conventionally, heat generated by the processor is transmitted by a thermal interface material (TIM) to a heat spreader that is in contact with a heat sink or other interface to exhaust the heat to a liquid coolant or to the ambient atmosphere. In some instances, the thermal management components and interfaces can limit the amount of heat exhausted. In the case of multi-die processors, conventional thermal management may be incapable of cooling all dies in the processor.

In some embodiments, an electrochemical fluid (such as a Vanadium salt) positioned in the microfluidic volume allows a processor or other heat-generating component to receive power from the electrochemical fluid, directly. The local power generation of the electrochemical fluid may limit and/or eliminate the need for electrical power delivery by wire traces from a power supply unit. Further, direct power delivery and/or thermal management of the electrochemical fluid may allow for more efficient power delivery and/or thermal management. For example, the electrochemical fluid may produce an electrical voltage on the order of that used by the processor or other heat-generating component without need for transforming electrical power (e.g., 120-Volt power) obtained from a grid or an on-site powerplant.

In some embodiments, the electrochemical fluid is urged through the first microfluidic volume and through the second microfluidic volume at the same flow rate. For example, a manifold forming at least a portion of the side wall of the microfluidic volumes may be connected to an inlet conduit may provide equal flow rate and/or equal fluid pressure to both the first microfluidic volume and the second microfluidic volume. In some embodiments, the flow rate is different, such as when different thermal management or power delivery is required by different portions of the processor or other heat-generating component. For example, a first inlet conduit may provide a first flow rate and/or fluid pressure to the first microfluidic volume and a second inlet conduit may provide a second flow rate and/or fluid pressure to the second microfluidic volume.

In some embodiments, a first electrochemical fluid (such as an anolyte) and a second electrochemical fluid (such as a catholyte) are flowed into a shared microfluidic volume with an inlet and an outlet. The first electrochemical fluid and second electrochemical fluid flow in parallel through the shared microfluidic volume with limited or no mixing. The boundary between the first electrochemical fluid and the second electrochemical fluid is substantially maintained by laminar flow of the first electrochemical fluid and second electrochemical fluid through the microfluidic volume with limited turbulence.

In some embodiments, combined electrical power delivery and thermal management by electrochemical fluids in a microfluidic volume according to the present disclosure allows for an increased density of processors in computing device, a server blade, a server rack, or a datacenter. For example, local power delivery and cooling may allow for a dense stack of wafers and/or stacked-die processors that are not possible with conventional PCB power delivery and separate thermal management.

In some embodiments, an electrochemical generation system includes an electrochemical chamber with an ion-transfer membrane dividing the electrochemical chamber. The electrochemical chamber includes a first electrochemical fluid and a second electrochemical fluid separated by the ion-transfer membrane. In some embodiments, ion-transfer across the ion-transfer membrane between the first electrochemical fluid and the second electrochemical fluid produces an electric voltage and current to the processor or other electrical load and discharges the first electrochemical fluid. In some embodiments, an applied voltage from an electrical source (in place of the electrical load) results in a reverse transfer of ions across the ion-transfer membrane which charges the first electrochemical fluid.

In some embodiments, the electrochemical chamber is in fluid communication with a first storage tank and a second storage tank. For example, the first electrochemical fluid is stored in the first storage tank and can flow into the electrochemical chamber, and the second electrochemical fluid is stored in the second storage tank and can flow into the electrochemical chamber. A first pump and second pump may control the flow of the first electrochemical fluid and the flow of the second electrochemical fluid, respectively to the electrochemical chamber. In some embodiments, the rate of ion-transfer across the ion-transfer membrane is at least partially related to a flow rate of the first electrochemical fluid and the second electrochemical fluid into the electrochemical chamber (and in contact with the ion-transfer membrane).

The electrical charge produced by the ion transfer across the ion-transfer membrane may be collected at a first electrode and a second electrode positioned in or on the electrochemical chamber on opposite sides of the ion-transfer membrane. For example, a first electrode is in contact with the first electrochemical fluid and a second electrode is in contact with the second electrochemical fluid. The electrodes collect charge from the first electrochemical fluid and the second electrochemical fluid. In some embodiments, the first electrochemical fluid in an anolyte fluid, and the second electrochemical fluid is a catholyte fluid. In some embodiments, the anolyte fluid and the catholyte fluid is the same fluid or compound in different states of charge. In at least one embodiment, the anolyte fluid and the catholyte fluid are or include a Vanadium salt.

In some embodiments, the electrochemical generator system has a processor as the electrical load and a separate electrical source connected to a second electrochemical chamber. In some embodiments, an electrochemical generator system includes a first electrochemical chamber configured to discharge an electrochemical fluid and provide an electrical power to an electrical load (e.g., the processor), and the electrochemical generator system includes a second electrochemical chamber configured to receive electrical power from an electrical source (e.g., a power grid or other power source) to recharge the electrochemical fluid.

In some embodiments, the electrochemical fluid circulates through the electrochemical generator system, receiving electrical power from the electrical source and delivering the electrical power to the electrical load, substantially continuously. In some embodiments, the electrochemical fluid is stored in a storage tank until the electrical power is needed similarly to a battery, when pumps flow the electrochemical fluid. As described above, a first electrochemical fluid and a second electrochemical fluid exchange ions across a first ion-transfer membrane in the first electrochemical chamber to discharge the first electrochemical fluid and produce electrical power. The first electrochemical fluid and a second electrochemical fluid exchange ions across a second ion-transfer membrane in the second electrochemical chamber to charge the first electrochemical fluid and store electrical power.

In some embodiments, at least a part of the electrochemical chamber configured to provide power is located in a microfluidic volume of a silicon substrate or other inactive portion of a computational package. For example, a first electrochemical fluid may be positioned in the microfluidic volume. In another example, a second electrochemical fluid may be positioned in the microfluidic volume. In yet another example, both the first electrochemical fluid and the second electrochemical fluid may be positioned in the microfluidic volume.

In some embodiments, a processing unit has a processor positioned on a first surface of a silicon substrate or other wafer. In some embodiments, the silicon substrate has an electrochemical chamber located on a second surface of the silicon substrate opposite the processor. While a heat-generating component is described in relation to a processor positioned on a silicon substrate, it should be understood that at least some of the structures, features, and elements described herein relate to any heat-generating component with active silicon or circuitry affixed to a silicon substrate or other wafer.

In some embodiments, the electrochemical chamber includes an ion-transfer membrane dividing the electrochemical chamber. The electrochemical chamber includes a first electrochemical fluid and a second electrochemical fluid separated by the ion-transfer membrane. In some embodiments, ion-transfer across the ion-transfer membrane between the first electrochemical fluid and the second electrochemical fluid produces an electric voltage and current to the processor or other electrical load and discharges the first electrochemical fluid.

The electrical voltage and current is, in some embodiments, provided to the processor, active silicon, or other electrical load on the first surface of the substrate by TSVs. The TSVs provide electrical communication from electrodes positioned in or adjacent to the electrochemical chamber. For example, the first electrode is positioned in or adjacent to the electrochemical chamber and configured to physically contact a first electrochemical fluid, and the second electrode is positioned in or adjacent to the electrochemical chamber and configured to physically contact a second electrochemical fluid.

In some embodiments, the electrochemical chamber is configured as an elongated channel in the second surface of the substrate. In such embodiments, the first electrochemical fluid and second electrochemical fluid flow through the electrochemical chamber to transfer ions therebetween and provide electrical power via the electrodes and to absorb heat from the processor, active silicon, or other heat-generating component on the first surface through the substrate.

In some embodiments, the electrochemical chamber is substantially rectangular in cross-section. The electrochemical chamber may have a uniform transverse cross-sectional along at least a portion of a longitudinal length of the electrochemical chamber, as will be described in more detail herein. In some embodiments, the electrochemical chamber has a non-uniform transverse cross-section that changes in at least one dimension along at least a portion of the longitudinal length of the electrochemical chamber. In some embodiments, at least a portion of the electrochemical chamber has a transverse cross-section that is or is a portion of a rectangle, square, triangle, hexagon, other regular polygonal shape, irregular polygon shape, circle, oval, ellipse, other regular curved shape, irregular curved shape, or combinations thereof.

In the above-described example, an electrochemical chamber provides both power and cooling locally to a processor. In some embodiments, local power production includes any production of electrical voltage or current proximate to or in the processor, active silicon, other electrical load, or a substrate by which the processor, active silicon, or other electrical load is supported. For example, a power supply unit (PSU) that is electrically connected to a processor through one or more wires or cables does not produce the electrical power locally to the processor, while an electrochemical chamber located in a substrate with ion transfer to create an electrical current is local to any processor, active silicon, or other electrical load located on the substrate.

In some embodiments, a processor, active silicon, or other electrical load requires a plurality of electrochemical chambers to flow electrochemical fluid therethrough to provide a sufficient amount of electrical power and/or cooling through the substrate. In some embodiments, a processing unit includes a processor powered by a plurality of electrochemical chambers positioned locally on a substrate.

In some embodiments, each electrochemical chamber includes an ion-transfer membrane dividing the electrochemical chamber. Each electrochemical chamber includes a first electrochemical fluid and a second electrochemical fluid separated by the ion-transfer membrane. In some embodiments, ion-transfer across the ion-transfer membrane between the first electrochemical fluid and the second electrochemical fluid produces an electric voltage and current to the processor or other electrical load and discharges the first electrochemical fluid.

The electrical voltage and current is, in some embodiments, provided to the processor, active silicon, or other electrical load on the first surface of the substrate by TSVs. The TSVs provide electrical communication from electrodes positioned in or adjacent to each electrochemical chamber. For example, a first electrode is positioned in or adjacent to the first electrochemical chamber and configured to physically contact a first electrochemical fluid, and a second electrode is positioned in or adjacent to the first electrochemical chamber and configured to physically contact a second electrochemical fluid.

In some embodiments, each electrochemical chamber is configured as an elongated channel in the second surface of the substrate. In such embodiments, the first electrochemical fluid and second electrochemical fluid flow through the electrochemical chamber to transfer ions therebetween and provide electrical power via the electrodes in each electrochemical chamber and to absorb heat from the processor, active silicon, or other heat-generating component on the first surface through the substrate.

In some embodiments, a processing unit includes a processor powered by an electrochemical chamber without an ion-transfer membrane. While embodiments of electrochemical chambers herein have been described with an ion-transfer membrane dividing the electrochemical chambers into a first portion and a second portion configured to contain a first electrochemical fluid and a second electrochemical fluid, respectively, in some embodiments, a narrow electrochemical chamber or channel allow for the first electrochemical fluid and the second electrochemical fluid to flow through the electrochemical chamber adjacent to and contacting one another with limited mixing therebetween.

The first electrochemical fluid and second electrochemical fluid in contact with one another at a boundary transfer ions freely therebetween, producing an electrical current. The first electrode and second electrode positioned in or adjacent to the electrochemical chamber provide the electrical power from the electrochemical fluids to the TSVs.

In some embodiments, the electrochemical chamber has a chamber width that is no more than 100 micrometers (μm). In some embodiments, the chamber width is in a range having an upper value, a lower value, or upper and lower values including any of 5 μm, 6 μm, 7 μm, 8 μm, 9 μm, 10 μm, 15 μm, 20 μm, 30 μm, 50 μm, 75 μm, 100 μm, 500 μm or any values therebetween. For example, the chamber width may be greater than 5 μm. In some examples, the chamber width is less than 500 μm. In some examples, the chamber width is between 5 μm and 100 μm. In some examples, the chamber width is between 5 μm and 50 μm. In some examples, the chamber width is between 10 μm and 40 μm.

In some embodiments, the first electrochemical fluid and the second electrochemical fluid flowing through the electrochemical chamber define a first portion and a second portion, respectively, when no membrane is present. When a membrane is present, the first portion containing the first electrochemical fluid and the second portion containing the second electrochemical fluid are defined by the membrane. In some embodiments, the first portion has a first portion width and the second portion has a second portion width that are equal to one another. In some examples, the first portion and second portion have cross-sectional areas that are equal.

In some embodiments, the first portion width and the second portion width are different from one another. For example, the first portion width may be greater than the second portion width or the second portion width may be greater than the first portion width. In some embodiments, the first portion width is in a range having an upper value, a lower value, or upper and lower values including any of 1 μm, 2 μm, 3 μm, 4 μm, 5 μm, 6 μm, 7 μm, 8 μm, 9 μm, 10 μm, 15 μm, 20 μm, 30 μm, 50 μm, or any values therebetween. For example, the first portion width may be greater than 1 μm. In some examples, the first portion width is less than 50 μm. In some examples, the first portion width is between 1 μm and 50 μm. In some examples, the first portion width is between 1 μm and 25 μm. In some examples, the first portion width is between 2.5 μm and 20 μm.

In some embodiments, the second portion width is in a range having an upper value, a lower value, or upper and lower values including any of 1 μm, 2 μm, 3 μm, 4 μm, 5 μm, 6 μm, 7 μm, 8 μm, 9 μm, 10 μm, 15 μm, 20 μm, 30 μm, 50 μm, or any values therebetween. For example, the second portion width may be greater than 1 μm. In some examples, the second portion width is less than 50 μm. In some examples, the second portion width is between 1 μm and 50 μm. In some examples, the second portion width is between 1 μm and 25 μm. In some examples, the second portion width is between 2.5 μm and 20 μm.

As described herein, the electrochemical chamber is, in some embodiments, an elongated channel through which the electrochemical fluid(s) flow to provide a substantially continuous supply of cool and charged electrochemical fluid(s). In some embodiments, a silicon substrate has an electrochemical chamber located in a second surface (e.g., bottom surface) thereof. The electrochemical chamber is an elongated channel separated by a ion-transfer membrane. The first portion of the electrochemical chamber contains a first electrochemical fluid, and the second portion of the electrochemical chamber contains a second electrochemical fluid.

In some embodiments, the first electrode and the second electrode are positioned adjacent to the first portion and the second portion of the electrochemical chamber to receive charge from the first electrochemical fluid and the second electrochemical fluid, respectively. In some embodiments, the first electrode and the second electrode are each in electrical communication with a TSV (oriented vertically into the substrate). In some embodiments, the electrochemical chamber includes one electrode for each of the first electrochemical fluid and the second electrochemical fluid. In some embodiments, the electrochemical chamber includes a plurality of electrodes for each of the first electrochemical fluid and the second electrochemical fluid.

In some embodiments, the electrochemical chamber has the same quantity of first electrodes and second electrodes to provide an equal contact area for charge collection. In some embodiments, the electrochemical chamber has a different quantity of first electrodes and second electrodes based on a shape or surface area of the electrochemical chamber. For example, an asymmetrical electrochemical chamber and/or an electrochemical chamber including different volumes of first electrochemical fluid and second electrochemical fluid may have different quantities or sizes of electrodes.

In some embodiments, a first electrode (or plurality of first electrodes) has an equal length to the second electrode (or plurality of first electrodes) in the direction of flow of the electrochemical fluids. In some embodiments, the electrochemical chamber has a different length of first electrodes (or plurality of first electrodes) and second electrodes (or plurality of second electrodes) based on a shape or surface area of the electrochemical chamber. For example, an asymmetrical electrochemical chamber and/or an electrochemical chamber including different volumes of first electrochemical fluid and second electrochemical fluid may have different lengths of electrodes.

In some embodiments, a first electrode (or plurality of first electrodes) has an equal area to the second electrode (or plurality of first electrodes). In some embodiments, the electrochemical chamber has a different area of first electrodes (or plurality of first electrodes) and second electrodes (or plurality of second electrodes) based on a shape or surface area of the electrochemical chamber. For example, an asymmetrical electrochemical chamber and/or an electrochemical chamber including different volumes of first electrochemical fluid and second electrochemical fluid may have different areas of electrodes.

The amount of power generated by the electrochemical fluids at the electrodes may be at least partially dependent on the quantity of charge of the electrochemical fluids. An increase in flowrate through the channel(s) of the electrochemical chamber may affect the available ions transferrable between the electrochemical fluids and increase the available electrical power in the electrochemical chamber. In some embodiments, the first electrochemical fluid and the second electrochemical fluid have a similar or substantially equal flowrate through the electrochemical chamber. For example, the flowrate in volume per second (e.g., milliliters per second) through the electrochemical chamber may be substantially equal between the first electrochemical fluid and the second electrochemical fluid. In some embodiments, the first electrochemical fluid and the second electrochemical fluid have a different flowrates through the electrochemical chamber. In at least one embodiment, a pump (such as described herein) may vary a first flowrate of the first electrochemical fluid and/or a second flowrate of the second electrochemical fluid independently of one another.

In some embodiments, the total thermal management capacity of the electrochemical fluids in the electrochemical chamber is at least partially related to a flowrate of the electrochemical fluids through the electrochemical chamber. An increase in flowrate through the channel(s) of the electrochemical chamber may affect the temperature difference between the electrochemical fluids and the surfaces of the electrochemical chamber from which the electrochemical fluids receive heat from the substrate. In some examples, an increase in flowrate through the channel(s) of the electrochemical chamber may increase the mass of electrochemical fluids flowing through the electrochemical chamber, allowing the electrochemical fluids to exhaust more heat from the substrate.

As described above, in some embodiments, the first electrochemical fluid and the second electrochemical fluid have a similar or substantially equal flowrate through the electrochemical chamber. For example, the flowrate in volume per second (e.g., milliliters per second) through the electrochemical chamber may be substantially equal between the first electrochemical fluid and the second electrochemical fluid. In some embodiments, the first electrochemical fluid and the second electrochemical fluid have a different flowrates through the electrochemical chamber. In at least one embodiment, a pump (such as described herein) may vary a first flowrate of the first electrochemical fluid and/or a second flowrate of the second electrochemical fluid independently of one another.

The electrochemical fluids may be directed into or towards the electrochemical chamber through one or more inlets of the substrate. In some embodiments, a first electrochemical fluid is directed into or towards the electrochemical chamber through a first inlet. In some embodiments, a second electrochemical fluid is directed into or towards the electrochemical chamber through a second inlet. In some embodiments, the first electrochemical fluid and second electrochemical fluid are both directed into or towards the electrochemical chamber at a shared inlet.

The electrochemical fluids may be directed out of or away from the electrochemical chamber through one or more outlets of the substrate. In some embodiments, a first electrochemical fluid is directed out of or away from the electrochemical chamber through a first outlet. In some embodiments, a second electrochemical fluid is directed out of or away from the electrochemical chamber through a second outlet. In some embodiments, the first electrochemical fluid and second electrochemical fluid are both directed out of or away from the electrochemical chamber at a shared outlet.

In some embodiments, the first electrochemical fluid and the second electrochemical fluid enter the channels of the substrate at a first inlet and a second inlet, respectively, that are located on the same edge of the substrate. The first electrochemical fluid and the second electrochemical fluid flow through the electrochemical chamber in cocurrent flow. Cocurrent flow may allow the electrochemical fluids to transfer electrical charge therebetween and/or receive heat from the substrate with a greatest charge difference and/or temperature difference proximate the inlets and less proximate the outlets.

In some embodiments, the first inlet and second inlet are located on opposite edges of the substrate and/or the first electrochemical fluid and the second electrochemical fluid flow through the electrochemical chamber in countercurrent flow. Countercurrent flow may allow the electrochemical fluids to transfer electrical charge therebetween and/or receive heat from the substrate with a substantially uniform transfer rate therebetween and/or a more uniform transfer rate compared to cocurrent flow.

In some embodiments, a silicon substrate has a plurality of branching channels that form a plurality of electrochemical chambers with countercurrent flow. It should be understood that, in other embodiments with a plurality of electrochemical chambers and/or branching channels, the electrochemical fluids flow with cocurrent flow. In some embodiments, a processor or other electrical load and heat-generating component has a footprint that is larger than a single electrochemical chamber can supply electrical power to and remove heat from. In some embodiments, a substrate has a plurality of electrochemical chambers to supply electrical power to the processor through a plurality of electrodes and TSVs through the substrate. In some embodiments, the substrate includes a first inlet for the first electrochemical fluid and a second inlet for the second electrochemical fluid located at opposite edges of the second surface of the substrate. In other embodiments, the inlets are located and/or oriented at other positions relative to one another to facilitate countercurrent flow and/or a plurality of electrochemical chambers.

In some embodiments, each of the electrochemical chambers that includes both the first electrochemical fluid and the second electrochemical fluid have a first electrode and a second electrode to receive charge from ion transfer between the electrochemical fluids. In some embodiments, the electrochemical chambers are divided by an ion-transfer membrane. Embodiments utilizing countercurrent flow may exhibit too much turbulence for a membrane-less boundary.

In some embodiments, each of the first electrochemical fluid and the second electrochemical fluid enter the substrate through inlets. In some embodiments, the first electrochemical fluid exits the substrate through outlets associated with each of the electrochemical chambers, respectively. In some embodiments, the second electrochemical fluid exits the substrate through outlets associated with each of the electrochemical chambers respectively. In some embodiments, at least one of the first electrochemical fluid and the second electrochemical fluid flows from the electrochemical chambers into a combined channel before exiting the substrate. By branching the flow of the first electrochemical fluid and the second electrochemical fluid into a plurality of electrochemical chambers, in some embodiments, electrical power and thermal management can be better distributed across the footprint of the processor than a single electrochemical chamber alone.

While a substrate with parallel electrochemical chambers is described herein, in other embodiments, electrochemical chambers are oriented at a diverging or converging (e.g., non-parallel) angle to one another. In some embodiments, a silicon substrate has a plurality of diverging electrochemical chambers. In some embodiments, a substrate has a plurality of electrochemical chambers positioned in a second surface opposite a processor or other electrical load/heat-generating component. Depending on the architecture of the processor or other electrical load/heat-generating component, different regions of the processor or other electrical load/heat-generating component require different amounts of electrical power and/or thermal management through the substrate.

In some embodiments, the electrochemical chambers are positioned in the substrate to position electrodes and TSVs where the processor or other electrical load/heat-generating component architecture needs electrical power. In some embodiments, the electrochemical chambers are positioned in the substrate to position electrodes and TSVs where the processor or other electrical load/heat-generating component architecture needs electrical power.

In some embodiments, at least one of the electrochemical chambers includes a plurality of sets of electrodes. Each set of electrodes is in electrical communication with a TSV to deliver electrical power to a portion of the processor or other electrical load/heat-generating component. In some embodiments, a first set of electrodes of an electrochemical chamber is positioned proximate a higher power consumption region of the processor or other electrical load/heat-generating component. For example, the available charge in the electrochemical fluids may decrease in a flow direction through the electrochemical chamber, and positioning a first set of electrodes of an electrochemical chamber proximate an inlet may allow a greater power production at the first set of electrodes and allow a greater thermal management of the high power consumption region of the processor or other electrical load/heat-generating component because the electrochemical fluids are cooler proximate the inlet relative to the outlet.

In some embodiments, the substrate includes a plurality of inlets and a plurality of outlets. In at least one embodiment, the substrate includes at least one inlet and at least one outlet for each of the electrochemical chambers.

A silicon substrate, in some embodiments, has a large-area electrochemical chamber. Embodiments of electrochemical chambers have been described herein with relation to a first electrochemical fluid and a second electrochemical fluid positioned in a first portion and second portion of the electrochemical chamber laterally adjacent to one another. In some embodiments, the first portion of the electrochemical chamber (containing a first electrochemical fluid) and the second portion of the electrochemical chamber (containing a second electrochemical fluid) are layered in substantially planar layers divided by an ion-transfer membrane therebetween. For example, the first portion and the second portion are layered in a direction perpendicular to a first surface and/or second surface of the substrate. In at least one example, a plane of the ion-transfer membrane is substantially parallel to the first surface and/or second surface of the substrate.

In some embodiments, a first inlet provides fluid flow of the first electrochemical fluid into the first portion of the electrochemical chamber. In some embodiments, a second inlet provides fluid flow of the second electrochemical fluid into the second portion of the electrochemical chamber. The first electrochemical fluid and second electrochemical fluid exchange ions across the ion-transfer membrane, and the resulting charge is collected at the electrodes.

In some embodiments, the electrodes are electrically connected to TSVs. The TSVs provide the electrical power to the processor or other electrical load/heat-generating component. In some embodiments, the TSVs are positioned in and/or supported by pin fins. In some embodiments, the pin fins are continuous through a full height of the electrochemical chamber (e.g., continuous between a first surface of the substrate and the second surface of the substrate) and provide support to the substrate and/or the ion-transfer membrane in the electrochemical chamber. In some embodiments, a pin fin is positioned through a portion of the electrochemical chamber less than a full height of the electrochemical chamber to provide support to the TSVs while reducing the fluidic drag on the electrochemical fluids.

The first electrochemical fluid and second electrochemical fluid flow out of the electrochemical chamber (the first portion and second portion, respectively) through outlets. In some embodiments, the inlets and outlets are positioned relative to one another in the electrochemical chamber to direct and control flow of the first electrochemical fluid and second electrochemical fluid, therethrough. For example, inlets and outlets may be positioned to control electrochemical fluid flow through the electrochemical chamber as needed for electrical power generation and/or thermal management. While the inlets and outlets are described herein on a second surface of the substrate, in some embodiments, inlets and/or outlets are on the lateral surface of the substrate.

In some embodiments, an electrochemical generator system includes a first electrochemical chamber configured to discharge an electrochemical fluid and provide an electrical power to an electrical load (e.g., the processor or other electrical load and/or heat-generating component), and the electrochemical generator system includes a second electrochemical chamber configured to receive electrical power from an electrical source (e.g., a power grid or other power source) to recharge the electrochemical fluid.

In some embodiments, the electrochemical fluid circulates through the electrochemical generator system, receiving electrical power from the electrical source and delivering the electrical power to the electrical load, substantially continuously. In some embodiments, the electrochemical fluid is stored in a storage tank until the electrical power is needed similarly to a battery, when pumps flow the electrochemical fluid. A first electrochemical fluid and a second electrochemical fluid exchange ions across a first ion-transfer membrane in the first electrochemical chamber to discharge the first electrochemical fluid and produce electrical power. The first electrochemical fluid and a second electrochemical fluid exchange ions across a second ion-transfer membrane in the second electrochemical chamber to charge the first electrochemical fluid and store electrical power.

In some embodiments, at least a part of the electrochemical chamber configured to provide power is located in a microfluidic volume substrate as illustrated and described herein. For example, a first electrochemical fluid may be positioned in the microfluidic volume. In another example, a second electrochemical fluid may be positioned in the microfluidic volume. In yet another example, both the first electrochemical fluid and the second electrochemical fluid may be positioned in the microfluidic volume.

The first electrochemical fluid and second electrochemical fluid may receive heat from the processor or other electrical load and/or heat-generating component of the electrochemical generator system. The first electrochemical fluid and second electrochemical fluid may flow from the processor or other electrical load and/or heat-generating component to the heat exchanger and exhaust at least a portion of the heat from the first electrochemical fluid and second electrochemical fluid. The first electrochemical fluid and second electrochemical fluid can thereby provide electrical power directly to the processor and remove heat from the processor in a single medium passing through the microfluidic volume of the processor.

In some embodiments, the first electrochemical fluid is received through a first inlet of a first substrate that supports a first processor or other electrical load and/or heat-generating component and a second electrochemical fluid is received through a second inlet of the first substrate. The first electrochemical fluid and the second electrochemical fluid flow through the electrochemical chamber, as described herein. In some embodiments, the first electrochemical fluid and the second electrochemical fluid receive heat from the processor or other electrical load and/or heat-generating component through the substrate. The first electrochemical fluid and the second electrochemical fluid have a higher temperature at the first outlet and the second outlet, compared to the temperature at the first inlet and the second inlet, respectively.

In some embodiments, the first electrochemical fluid and the second electrochemical fluid are directed from the first outlet and the second outlet to a second substrate that supports a second processor or other electrical load and/or heat-generating component to power and/or cool the second processor or other electrical load and/or heat-generating component.

In some embodiments, the second processor or other electrical load and/or heat-generating component is a lower power consumption component compared to the first processor or other electrical load and/or heat-generating component, and the remaining charge in the first electrochemical fluid and the second electrochemical fluid is used to power the second processor or other electrical load and/or heat-generating component. However, the first electrochemical fluid and the second electrochemical fluid are at an elevated temperature after receiving heat from the first processor or another electrical load and/or heat-generating component.

In at least one embodiment, the first electrochemical fluid and the second electrochemical fluid are cooled before entering the second substrate at the inlets of the second substrate. The first electrochemical fluid and the second electrochemical fluid flow to and through a heat exchanger. The heat exchanger exhausts heat from the first electrochemical fluid and the second electrochemical fluid to ambient air or to another fluid that exhausts the heat. The cooled first electrochemical fluid and the second electrochemical fluid flow from the heat exchanger to the electrochemical chamber of the second substrate to provide power and further cooling to the second processor or other electrical load and/or heat-generating component before exiting the electrochemical chamber of the second substrate through the outlets. The first electrochemical fluid and the second electrochemical fluid, in some embodiments, are further cooled and recharged, such as described herein.

In some embodiments, and particularly in the layer embodiment of an electrochemical chamber described herein, the first electrochemical fluid and second electrochemical fluid receive different amounts of heat through the substrate and/or change temperature by a different amount. For example, the first electrochemical fluid is positioned closer to the processor or other electrical load and/or heat-generating component and may receive more heat. In some examples, such as when the first electrochemical fluid and the second electrochemical fluid are laterally adjacent one another in the electrochemical chamber, such as described herein, the first electrochemical fluid and the second electrochemical fluid may receive the same amount of heat but change temperature by different amounts due to different heat capacities of the first electrochemical fluid and the second electrochemical fluid.

In some embodiments, the first electrochemical fluid is received through a first inlet of a first substrate that supports a first processor or other electrical load and/or heat-generating component and a second electrochemical fluid is received through a second inlet of the first substrate. The first electrochemical fluid and the second electrochemical fluid flow through the electrochemical chamber, as described herein. In some embodiments, the first electrochemical fluid and the second electrochemical fluid receive different amounts of heat from the processor or other electrical load and/or heat-generating component through the substrate. The first electrochemical fluid and the second electrochemical fluid have a higher temperature at the first outlet and the second outlet, compared to the temperature at the first inlet and the second inlet, respectively, with the first electrochemical fluid increasing in temperature more than the second electrochemical fluid.

In some embodiments, the first electrochemical fluid and the second electrochemical fluid are directed from the first outlet and the second outlet to a second substrate that supports a second processor or other electrical load and/or heat-generating component to power and/or cool the second processor or other electrical load and/or heat-generating component.

In some embodiments, the second processor or other electrical load and/or heat-generating component is a lower power consumption component compared to the first processor or other electrical load and/or heat-generating component, and the remaining charge in the first electrochemical fluid and the second electrochemical fluid is used to power the second processor or other electrical load and/or heat-generating component. However, the first electrochemical fluid and the second electrochemical fluid are at an elevated temperature after receiving heat from the first processor or another electrical load and/or heat-generating component.

In at least one embodiment, the first electrochemical fluid and the second electrochemical fluid are cooled before entering the second substrate at the inlets of the second substrate. The first electrochemical fluid flows to and through a first heat exchanger and the second electrochemical fluid flows to and through a second heat exchanger. The heat exchangers exhaust heat from the first electrochemical fluid and the second electrochemical fluid to ambient air or to another fluid that exhausts the heat. In some embodiments, the heat exchangers cool the first electrochemical fluid and the second electrochemical fluid by different amounts. In some embodiments, the heat exchangers cool the first electrochemical fluid and the second electrochemical fluid to the same temperature.

The cooled first electrochemical fluid and the second electrochemical fluid flow from the heat exchanger to the electrochemical chamber of the second substrate to provide power and further cooling to the second processor or other electrical load and/or heat-generating component before exiting the electrochemical chamber of the second substrate through the outlets. The first electrochemical fluid and the second electrochemical fluid, in some embodiments, are further cooled and recharged, such as described herein.

Recirculating the recharged and cooled electrochemical fluid can allow the electrochemical fluid to provide electrical power and thermal management directly to the dies of a processor substantially continuously. In at least one embodiment, delivery of electrochemical fluid to the microfluidic volume of a processor can allow combined power delivery and thermal management and allow for smaller, more powerful, more efficient, and more reliable processors.

The present disclosure relates to systems and methods for combined power delivery and cooling to a processor according to at least the examples provided in the sections below:

[A1] In some embodiments, a processing unit includes a substrate, an electrical load, and a microfluidic volume. The electrical load is supported by the first surface of the substrate, and the microfluidic volume is positioned in the second surface of the substrate. The processing unit includes a first electrode positioned in the microfluidic volume and a second electrode positioned in the microfluidic volume. A first TSV connects the first electrode to the electrical load, and a second TSV connects the second electrode to the electrical load. An electrochemical fluid is positioned in the microfluidic volume to provide electrical power to the electrical load and receive heat from the electrical load.

[A2] In some embodiments, the electrochemical fluid of [A1] is a first electrochemical fluid, and a second electrochemical fluid is positioned in the microfluidic volume.

[A3] In some embodiments, an ion-transfer membrane is between the first electrochemical fluid and the second electrochemical fluid of [A2].

[A4] In some embodiments, the first electrochemical fluid of [A2] or [A3] is an anolyte, and the second electrochemical fluid of [A2] or [A3] is a catholyte.

[A5] In some embodiments, the first electrochemical fluid and second electrochemical fluid of any of [A2] through [A4] are configured in countercurrent flow.

[A6] In some embodiments, the microfluidic volume of any of [A1] through [A5] has a chamber width less than 500 micrometers.

[A7] In some embodiments, the electrochemical fluid of [A1] is a first electrochemical fluid, the microfluidic volume includes a first portion containing the first electrochemical fluid and a second portion containing a second electrochemical fluid, and a first portion width is different from a second portion width.

[A8] In some embodiments, a cross-sectional area of the microfluidic volume of any of [A1] through [A7] changes in a direction of flow of the electrochemical fluid.

[A9] In some embodiments, a cross-sectional shape of the microfluidic volume of any of [A1] through [A8] changes in a direction of flow of the electrochemical fluid.

[A10] In some embodiments, the substrate of any of [A1] through [A9] is a silicon wafer.

[A11] In some embodiments, the first electrode and second electrode of any of [A1] through [A10] are a first set of electrodes positioned in the microfluidic volume, and the device further comprises a second set of electrodes positioned in the microfluidic volume.

[A12] In some embodiments, the microfluidic volume of any of [A1] through [A11] includes a first electrochemical chamber and a second electrochemical chamber, and the first electrode and second electrode are a first set of electrodes positioned in the first electrochemical chamber, and a second set of electrodes is positioned in the second electrochemical chamber.

[A13] In some embodiments, the first electrochemical chamber and the second electrochemical chamber of [A12] are parallel to one another.

[A14] In some embodiments, the first electrochemical chamber and the second electrochemical chamber of [A12] are branches of the microfluidic volume.

[B1] In some embodiments, a processing unit includes a substrate, an electrical load, and an electrochemical chamber. The electrical load is supported by the first surface of the substrate, and the electrochemical chamber is positioned in the substrate. The electrochemical chamber includes an ion-transfer membrane dividing the electrochemical chamber into a first portion and a second portion. The electrochemical chamber includes a first electrode positioned in the first portion and a second electrode positioned in the second portion. A pin fin is positioned in the electrochemical chamber and configured to support the ion-transfer membrane relative to the substrate. A TSV in the pin fin connects one of the first electrode and the second electrode to the electrical load. A first electrochemical fluid is positioned in the first volume and a second electrochemical fluid is positioned in the second volume to provide electrical power to the electrical load and receive heat from the electrical load.

[B2] In some embodiments, the ion-transfer membrane of [B1] has a plane parallel to the second surface of the substrate.

[B3] In some embodiments, the first portion, ion-transfer membrane, and second portion of [B2] are layered in a direction perpendicular to the second surface.

[C1] In some embodiments, a system for electrochemical generation includes a processing unit, a first electrochemical storage tank, a second electrochemical storage tank, and a heat exchanger. The processing unit includes a substrate, an electrical load, and an electrochemical chamber. The electrical load is supported by the first surface of the substrate, and the electrochemical chamber is positioned in the second surface of the substrate. The electrochemical chamber includes an ion-transfer membrane dividing the electrochemical chamber into a first portion and a second portion. The electrochemical chamber includes a first electrode positioned in the first portion and a second electrode positioned in the second portion. A first TSV connects the first electrode to the electrical load, and a second TSV connects the second electrode to the electrical load. A first electrochemical fluid is positioned in the first volume and a second electrochemical fluid is positioned in the second volume to provide electrical power to the electrical load and receive heat from the electrical load. The first electrochemical storage tank is in fluid communication with the first portion, and the second electrochemical fluid storage tank is in fluid communication with the second portion. The heat exchanger is in fluid communication with at least one of the first electrochemical fluid and second electrochemical fluid and configured to exhaust heat from the at least one of the first electrochemical fluid and second electrochemical fluid.

[C2] In some embodiments, the heat exchanger of [C1] is a first heat exchanger in fluid communication with the first electrochemical fluid and configured to exhaust heat from the first electrochemical fluid, and the system further includes a second heat exchanger in fluid communication with the second electrochemical fluid and configured to exhaust heat from the second electrochemical fluid.

[C3] In some embodiments, the processing unit of [C1] is a first processing unit, and the system further comprises a second processing unit including a substrate, an electrical load, and an electrochemical chamber. The electrical load is supported by the first surface of the substrate, and the electrochemical chamber is positioned in the second surface of the substrate. The electrochemical chamber includes an ion-transfer membrane dividing the electrochemical chamber into a first portion and a second portion. The electrochemical chamber includes a first electrode positioned in the first portion and a second electrode positioned in the second portion. A first TSV connects the first electrode to the electrical load, and a second TSV connects the second electrode to the electrical load. A first electrochemical fluid is positioned in the first volume and a second electrochemical fluid is positioned in the second volume to provide electrical power to the electrical load and receive heat from the electrical load. At least the first electrochemical fluid is configured to flow from an outlet of the substrate of the first processing unit to the heat exchanger, and from the heat exchanger to an inlet of the substrate of the second processing unit.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the scope of the present disclosure, and that various changes, substitutions, and alterations may be made to embodiments disclosed herein without departing from the scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A processing unit comprising:

a processor including:

a substrate having a first surface and an opposite second surface, the substrate being an inactive silicon of the processing unit, and an electrical load supported by the first surface of the substrate, the electrical load being the active silicon of the processing unit;

an electrochemical generator including:

a microfluidic volume positioned recessed within the second surface of the substrate, a first electrode positioned in the microfluidic volume;

a second electrode positioned in the microfluidic volume;

a first through silicon via (TSV) through the substrate connecting the first electrode to the electrical load;

a second TSV through the substrate connecting the second electrode to the electrical load; and an electrochemical fluid positioned in the microfluidic volume to provide electrical power to the electrical load and receive heat from the electrical load.

2. The processing unit of claim 1, wherein the electrochemical fluid is a first electrochemical fluid, and a second electrochemical fluid is positioned in the microfluidic volume.

3. The processing unit of claim 2, further comprising an ion-transfer membrane between the first electrochemical fluid and the second electrochemical fluid.

4. The processing unit of claim 2, wherein the first electrochemical fluid is an anolyte and the second electrochemical fluid is a catholyte.

5. The processing unit of claim 2, wherein the first electrochemical fluid and second electrochemical fluid are configured in countercurrent flow.

6. The processing unit of claim 1, wherein microfluidic volume has a chamber width less than 500 micrometers.

7. The processing unit of claim 1, wherein the electrochemical fluid is a first electrochemical fluid, the microfluidic volume includes a first portion containing the first electrochemical fluid and a second portion containing a second electrochemical fluid, and a first portion width is different from a second portion width.

8. The processing unit of claim 1, wherein a cross-sectional area of the microfluidic volume changes in a direction of flow of the electrochemical fluid.

9. The processing unit of claim 1, wherein a cross-sectional shape of the microfluidic volume changes in a direction of flow of the electrochemical fluid.

10. The processing unit of claim 1, wherein the inactive silicon is a silicon wafer.

11. The processing unit of claim 1, wherein the first electrode and second electrode are a first set of electrodes positioned in the microfluidic volume, and further comprising a second set of electrodes positioned in the microfluidic volume.

12. The processing unit of claim 1, wherein the microfluidic volume includes a first electrochemical chamber and a second electrochemical chamber, and the first electrode and second electrode are a first set of electrodes positioned in the first electrochemical chamber, and a second set of electrodes is positioned in the second electrochemical chamber.

13. The processing unit of claim 12, wherein the first electrochemical chamber and the second electrochemical chamber are parallel to one another.

14. The processing unit of claim 12, wherein the first electrochemical chamber and the second electrochemical chamber are branches of the microfluidic volume.

15. A processing unit comprising:

a processor including:

a inactive silicon having a first surface and an opposite second surface;

an active silicon supported by a first surface of the inactive silicon; and an electrochemical chamber positioned in the inactive silicon, wherein the electrochemical chamber includes:

an ion-transfer membrane dividing the electrochemical chamber include a first portion and a second portion, a first electrode positioned in a first portion of the electrochemical chamber, a second electrode positioned in a second portion of the electrochemical chamber, a pin fin positioned in the electrochemical chamber and configured to support the ion-transfer membrane relative to the inactive silicon, at least one electrode supported by the pin fin in the electrochemical chamber, a through silicon via (TSV) in the pin fin and connecting the at least one electrode to the active silicon, a first electrochemical fluid positioned in the first portion, and a second electrochemical fluid positioned in the second portion.

16. The processing unit of claim 15, wherein the ion-transfer membrane has a plane parallel to the second surface of the substrate.

17. The processing unit of claim 16, wherein the first portion, ion-transfer membrane, and second portion are layered in a direction perpendicular to the second surface.

18. A system for electrochemical generation comprising:

a processing unit including:

a processor including:

inactive silicon having a first surface and an opposite second surface, and active silicon supported by a first surface of the inactive silicon, and an electrochemical chamber positioned in the inactive silicon, wherein the electrochemical chamber includes:

an ion-transfer membrane dividing the electrochemical chamber into a first portion and a second portion, a first electrode positioned in a first portion of the electrochemical chamber, a second electrode positioned in a second portion of the electrochemical chamber, a through silicon via (TSV) through at least a portion of the inactive silicon and connecting the first electrode to the active silicon, a first electrochemical fluid positioned in the first portion, and a second electrochemical fluid positioned in the second portion;

a first electrochemical fluid storage tank in fluid communication with the first portion;

a second electrochemical fluid storage tank in fluid communication with the second portion; and a heat exchanger in fluid communication with at least one of the first electrochemical fluid and second electrochemical fluid and configured to exhaust heat from the at least one of the first electrochemical fluid and second electrochemical fluid.

19. The system of claim 18, wherein the heat exchanger is a first heat exchanger in fluid communication with the first electrochemical fluid and configured to exhaust heat from the first electrochemical fluid, and further comprising a second heat exchanger in fluid communication with the second electrochemical fluid and configured to exhaust heat from the second electrochemical fluid.

20. The system of claim 18, wherein the processing unit is a first processing unit, and the system further comprises a second processing unit including:

an inactive silicon having a first surface and an opposite second surface, an active silicon supported by a first surface of the inactive silicon, and an electrochemical chamber positioned in the substrate, wherein the electrochemical chamber includes:

an ion-transfer membrane dividing the electrochemical chamber include a first portion and a second portion, a first electrode positioned in a first portion of the electrochemical chamber, a second electrode positioned in a second portion of the electrochemical chamber, a through silicon via (TSV) through at least a portion of the substrate and connecting the first electrode to the electrical load, a first electrochemical fluid positioned in the first portion, and a second electrochemical fluid positioned in the second portion, wherein at least the first electrochemical fluid is configured to flow from an outlet of the inactive silicon of the first processing unit to the heat exchanger, and from the heat exchanger to an inlet of the inactive silicon of the second processing unit.

* * * * *